United States Patent
Kurihara et al.

(10) Patent No.: US 7,720,632 B2
(45) Date of Patent: May 18, 2010

(54) DIMENSION MEASURING APPARATUS AND DIMENSION MEASURING METHOD FOR SEMICONDUCTOR DEVICE

(75) Inventors: Masaru Kurihara, Kawasaki (JP); Masaru Izawa, Hino (JP); Junichi Tanaka, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 27 days.

(21) Appl. No.: 12/128,364

(22) Filed: May 28, 2008

(65) Prior Publication Data

US 2008/0319709 A1 Dec. 25, 2008

(30) Foreign Application Priority Data

Jun. 21, 2007 (JP) ............................. 2007-163743

(51) Int. Cl.
 G01B 15/00 (2006.01)
 G01N 23/00 (2006.01)
(52) U.S. Cl. ....................... 702/155; 250/310
(58) Field of Classification Search ............... 702/155; 438/14; 250/310; 700/121
See application file for complete search history.

(56) References Cited

U.S. PATENT DOCUMENTS

| | | | |
|---|---|---|---|
| 5,105,362 A * | 4/1992 | Kotani | ........................ 700/108 |
| 6,622,059 B1 | 9/2003 | Toprac et al. | |
| 6,708,075 B2 | 3/2004 | Sonderman et al. | |
| 6,842,658 B2 | 1/2005 | Izawa | |
| 7,335,881 B2 * | 2/2008 | Tanaka et al. | ............... 250/311 |

| | | |
|---|---|---|
| 2002/0056700 A1 | 5/2002 | Ohmori et al. |
| 2007/0238204 A1 | 10/2007 | Kurihara et al. |

FOREIGN PATENT DOCUMENTS

| | | |
|---|---|---|
| JP | 2002-151465 | 5/2002 |
| JP | 2003-531491 | 10/2003 |
| JP | 2005-510083 | 4/2005 |
| WO | 2006/030581 | 3/2006 |

OTHER PUBLICATIONS

"Metrology of LER: influence of line-edge roughness (LER)on transistor performance" by A. Yamaguchi, et al. pp. 468-476.
"Application of Optical CD for Characterization of 70nm Dense Lines" by B. Cheung, et al., pp. 30-40.
"The role of AFM in semiconductor technology development: the 65 nm technology node and beyond" by V. Ukraintsev, et al. pp. 127-139.
"Use of Design Pattern Layout for Automated Metrology Recipe Generation" by C. Tabery, pp. 1424-1434.

* cited by examiner

Primary Examiner—Bryan Bui
(74) Attorney, Agent, or Firm—Brundidge & Stanger, P.C.

(57) ABSTRACT

A dimension measuring apparatus used for measuring a dimension of a semiconductor device having a first pattern of repeated structure and a second pattern that is linear and formed on the first pattern to extend over the repeated structure. The invention includes a shape information acquisition unit which acquires information on a shape of the first pattern; a width value acquisition unit which acquires a width value of each portion of the second pattern; an analytic area setting unit, which sets a plurality of analytic areas on the second pattern; and a dimension determining unit, which extracts, for each of the set analytic areas, width values of portions included in the analytic area, and uses the extracted width values to determine a dimension of the second pattern at portions overlapping the first pattern.

15 Claims, 29 Drawing Sheets

DIMENSION MEASURING APPARATUS AND DIMENSION MEASURING METHOD FOR SEMICONDUCTOR DEVICE

CLAIM OF PRIORITY

The present application claims priority from Japanese application JP 2007-163743 filed on Jun. 21, 2007, the content of which is hereby incorporated by reference into this application.

BACKGROUND OF THE INVENTION

The present invention relates to a technique of measuring a dimension of a semiconductor device, for example, a dimension of a gate electrode on an activation region.

Recently, the size of a semiconductor device is becoming more miniaturized, and the dimension accuracy is required more strictly so that a gate electrode of 0.1 µm or less should be processed to have the dimensional accuracy of 10% or less. For example, the size of a gate electrode is one of main factors that determine operating characteristics of a semiconductor device, and it is particularly necessary to control the dimension of a gate electrode on an activation region. In manufacturing process, the dimension of a gate electrode varies being affected not only by a gate electrode fabrication process but also by the film thickness of the gate electrode and processes performed before the gate electrode fabrication process, such as a process affecting the dimension of a resist pattern used as a mask at the time of the processing of the gate electrode. As a result, even if a gate electrode is fabricated according to the same fabrication process under the same processing conditions, the finished dimension of the fabricated gate electrode does not become a constant value owing to accumulation of minute variations in those processes. For example, for the target value of 90 nm of a finished dimension of a fabricated gate electrode, there arises variation of the finished dimension in the range of about 10 nm at 3σ. This will cause worsening of dimensional accuracy, and eventually productivity will be lowered. Thus, control of a gate electrode dimension is indispensable technique in manufacturing process of a semiconductor device.

In manufacturing process of a semiconductor device, dimensions of gate electrodes in a wafer are measured. When measuring results miss a control value, the wafer is discarded or subjected to, for example, reprocessing in order to improve the yield and productivity. Recently, introduction of process control using such measured values is promoted. For example, Patent Document 1 shows a method of modifying processing conditions of control processes. In the method disclosed in Patent Document 1, a first process is performed on a semiconductor wafer to acquire integrated measured data relating to the process, and then, at least one error is specified from the integrated measured data, and an adjustment process for a second process is performed in order to compensate the error.

Another example is shown in Patent Document 2. Patent Document 2 includes a step in which a work-piece is processed and a step in which a transistor model is used for outputting feature parameters from measured feature parameters. Further, the method disclosed in the Patent Document 2 uses a step in which the output step is used to predict a wafer electrical test, a step in which a defective process is detected on the basis of the predicted values, and a step in which the defective process is corrected. Further, Patent Document 3 describes a method in which a dimension of an element isolation region is controlled by feed-forward. Patent Document 3 discloses a method in which a model formula for a surface step between an element isolation region and an activation region is generated. The model formula based on data of film thickness measured after Chemical Mechanical Polishing (CMP) is used for controlling the surface step to be constant by controlling the length of time of a cleaning process for removing a buried oxide film.

When such process control is performed, the accuracy of measurement results and improvement of throughput become important factors for the accuracy of the process control.

On the other hand, in recent lithographic techniques, the wavelength of a light source becomes shorter in order to cope with miniaturization of line-width, and, in association with this, resist material is changed. Particularly, as shown in Non-patent Document 1, line-width variation called Line Edge Roughness (LER) is obvious in the case of a resist material adapted for ArF excimer laser having the light source wavelength 193 nm (hereinafter, referred to as ArF resist). The variation of the line-width is about 6 nm at 3σ. Accordingly, in measuring a dimension of line-width, there is a problem that measurements of line-width at different places of the same line lead to different measurements. Thus, there is a problem that dimension measurement accuracy becomes worse in a dimensional inspection process of a semiconductor device manufacturing process using a resist pattern of a large LER. On the other hand, a method that can measure a minute pattern of line-width 0.1 µm or less with high accuracy and at a high speed is required.

Under these conditions, some methods of measuring line-width are proposed. One of them is a line-width measuring method using a Critical Dimension-Scanning Electron Microscope (CD-SEM), which is used most widely today. The characteristic of a CD-SEM is that it uses an electron beam so that it can obtain a high-resolution image even if line-width is 0.1 µm or less and it can measure any measuring object. Further, it is known that generally ArF resist shrinks by irradiation of an electron beam, and the shrinkage depends on the exposure dose. However, the latest model of CD-SEM has a function of automatizing measurement to reduce shrinkage to the minimum for each measuring object and a function (Rectangular Scan) of widening intervals of electron beam scanning to reduce the shrinkage. By changing electron beam scanning intervals, the Rectangular Scan function can obtain an image whose longitudinal magnification and lateral magnification are different from each other. This line-width measuring method using a CD-SEM is relatively fast, and can measure any measuring object with high accuracy. A CD-SEM performs processing in which a thus-obtained image of a wiring pattern is used for detecting many edge points of both ends of wiring on the basis of a contrast profile of the image and defines an average value of distances between edges as a dimension of the wiring. In this measurement, the longer the measured area is, the more the variation in measurements owing to LER can be reduced. Thus, the measuring method using a CD-SEM can measure an object with very high accuracy since it uses an electron beam.

As another method, there is a method using the scatterometry as shown in Non-patent Document 2. This method obtains optical interference waveform from patterns arranged to show a pitch over an area of 50 µm square or more. In this method, line-width is measured by comparing an interference waveform obtained by simulation using a structure model of the measuring object with an actually-obtained interference waveform. As a characteristic of this line-width measuring method using the scatterometry, it can relatively rapidly measure limited patterns such as the above-described ones that have simple structure for simulation and are arranged to show a pitch over an area of 50 μm square or more.

As another method, there is a line-width measuring method using a Critical Dimension-Atomic Force Microscope (CD-AFM) as shown in Non-patent Document 3. To measure a line-width, this method uses a minute probe to perform three-dimensional measurement of a measuring object directly. Since a measuring object is directly measured, the three-dimensional structure of the measuring object can be grasped. Further, its measurement accuracy largely depends on the size of a measuring object and the shape and dimension of the probe. Thus, as described above, there are a plurality of methods for measuring a line-width, and a suitable method is used depending on a purpose of measurement.

A measuring object used for dimension control is usually called a Quality Check (QC) pattern. In many cases, a QC pattern is arranged on a place called a scribe line, which is in a space between product chips and is to be cut by dicing. Further, in many cases, QC patterns are laid out to form a simple line or a plurality of lines/spaces for the sake of convenience of measurement. Actually, however, the performance and yield of a semiconductor device are determined by dimensions of wiring in operating circuit patterns, specifically dimensions of wiring on activation regions. A circuit pattern and a QC pattern are different from each other in complexity of their pattern shapes including lower layers, and thus different in behavior to dimensional variation. Thus, in dimensional control, the performance and yield of an actual semiconductor device can not be controlled sufficiently even if a dimension of a QC pattern is controlled. It is favorable to measure directly the dimension of a gate electrode of a circuit pattern. However, it is difficult to use measurement of a line-width of a specific place in a circuit for dimension control, since preparation of a measurement recipe is complicated and measurement accuracy of an individual point becomes lower because of the above-mentioned LER. Non-patent Document 4 describes a technique that can simply prepare a measurement recipe for dimension measurement in a circuit pattern. This technique uses design data to prepare a measurement recipe, and can measure a target place taking a plurality of layers into consideration. In other words, this technique can measure a line-width on an activation region.

Further, in many cases, a circuit pattern is formed such that activation regions and element isolation regions are arranged periodically. Non-patent Document 5 describes that, when there is such structure in a lower layer, dimensions of gate electrodes vary depending on that structure. This means that a dimension of a gate electrode on an activation region is different from a dimension on an element isolation region. Thus, when there is structure in a lower layer, an average dimension for the whole wiring is different from a dimension on an activation region. Also with respect to a resist pattern that becomes a mask for etching, it is confirmed that there is a phenomenon of variation in dimensions of wiring between on an activation region and on an element isolation region. Thus, as a wiring dimension that affects the performance and yield of a semiconductor device directly, it is necessary to measure a dimension on an activation region.

As described above, methods of measuring a minute measuring object with high accuracy have been proposed as follows.

Patent Document 1: Tokuhyo 2005-510083 (Published Japanese translation of published PCT application);

Patent Document 2: Tokuhyo 2003-531491 (Published Japanese translation of published PCT application);

Patent Document 3: Japanese Un-examined Patent Application Laid-Open No. 2002-151465;

Non-patent Document 1: A. Yamaguchi, et al., Proceedings of SPIE, vol. 5375, pp. 468-476 (2004);

Non-patent Document 2: B. Cheung et al., Proceedings of SPIE, vol. 5752, pp. 30-40 (2005);

Non-patent Document 3: V. A. Ukraintsev, et al., Proceedings of SPIE, vol. 5752, pp. 127-139 (2005);

Non-patent Document 4: C. Tabery, et al., Proceedings of SPIE, vol. 5752, pp. 1424-1434 (2005); and Non-patent Document 5: M. Kurihara, et al., Proceedings of DPS, pp. 181-182 (2006);

As recent requests for processing accuracy become more rigid, it is more difficult to realize requested processing accuracy by simple improvement of individual processes. Thus, there is a method in which process control is performed so that a dimension as a control object is stabilized to be some standard value. Further, the performance and yield of a semiconductor product is determined not by a wiring dimension of a QC pattern but a wiring dimension of a circuit pattern, particularly on an activation region. Thus, it is necessary to measure a dimension on an activation region with high accuracy and at a high speed and to control the dimension of wiring.

Further, as a method of measuring a dimension of wiring, Non-patent Document 1 describes a method that uses a CD-SEM and an image of an area long in the length-wise direction of wiring. It is expected that this method will reduce variation in measurements owing to LER and be effective in improving measurement accuracy. Since, however, this method calculates, as a line-width, an average value over the whole measurement area, this method is not appropriate for calculation of a dimension only on an activation region. Further, this method employs image recognition in order to specify a target place of measurement, and this becomes one factor causing reduction of throughput of measurement.

As another measuring method, Non-patent Document 2 describes a measuring method using the scatterometry. This method can measure at a high speed. However, this method can measure only an average dimension in an area of 50 μm square, and thus is not sufficient for calculation of a dimension on an activation region.

Further, as another measuring method, Non-patent Document 3 describes a method using an AFM. This method is effective in obtaining a three-dimensional image of a pattern to be measured. However, since it takes a long time for measuring one point and there is no mechanism for extracting a dimension on an activation region, the method is insufficient to be used for an apparatus for inspecting a dimension of wiring in manufacturing process of a semiconductor device.

Further, as another measuring method, Non-patent Document 4 describes a method using a CD-SEM for measuring a dimension of wiring on an activation region. Since this method uses design data, it is possible to measure a dimension of wiring on any activation region in a circuit pattern. Further, to specify a measurement value on an activation region, a pattern layout generated from design data is compared with a pattern obtained from an actual SEM image, and a place to be measured is specified by image recognition. However, this method shows variation in measurements owing to the above-mentioned LER, and thus, measurement accuracy for each point is lower. Further, although it is possible to reduce variation in measurements owing to LER by increasing the number of points to be measured, the length of time required for measuring one point becomes longer since points to be measured are specified by image recognition. Thus, throughput of the method is insufficient to be applied to a wiring dimension inspection process.

In summary, to improve the performance and yield of a semiconductor device, a means of measuring a dimension on an activation region of a circuit pattern is required, and further, a method of managing and controlling the measured dimension is required. The conventional techniques are, however, insufficient to measure a dimension of wiring on an activation region with high accuracy and at a high speed.

Usually, a pattern to be measured at the time of control of dimension exists between semiconductor chips, and a QC pattern positioned at a part to be cut by dicing is measured. A QC pattern has a relatively simple layout for the sake of easiness of measurement. In dimension control, a dimension of such a simple layout is measured to examine whether an abnormal value or the like exists. Further, also in process control, measured data of a QC pattern is used. However, in comparison with a layout of a QC pattern, a layout of an actually-operating circuit pattern has a very complicated shape including not only a gate electrode but also lower layers of element isolation regions and the like. As a result, behavior of a dimension of a circuit pattern and behavior of a dimension of a QC pattern, i.e. behaviors such as variations in a wafer surface or variations between wafers or lots, do not necessarily coincide with each other. It is improvement in device characteristics and improvement in yield that is important in manufacturing of a semiconductor device. Further, those improvements are directly affected not by a dimension of a QC pattern but by a dimension of a circuit pattern. Particularly, it is essential to control accurately a dimension of a gate pattern on an activation region. Further, it is considered to place a circuit pattern on a scribe line to treat the pattern as a QC pattern and to control its dimension. However, a layout of a circuit pattern is complicated and thus it is difficult to measure such a circuit pattern with high accuracy. Further, in the case of measurement of a dimension of a gate electrode over an activation region in a circuit pattern, it is complicated to prepare a measurement recipe for a measuring apparatus, and variation in measurements owing to LER lowers the measurement accuracy. For these two reasons, it is difficult to introduce dimension control of a circuit pattern into an actual production line.

As shown in Non-patent document 4, as a means of measuring a dimension of a gate electrode on an activation region in a circuit pattern, there is a method of preparing a measurement recipe for a measuring apparatus on the basis of design data. This method uses not only a layout of a gate electrode but also design data of lower layers. As a result, it is possible to prepare easily a measurement recipe for measuring a dimension on an activation region at any place in a circuit pattern. However, even if this method is employed, accuracy of measured data of each individual point is lower because of variation owing to LER. It is considered to increase the number of points to be measured and to take an average value of them, to reduce measurement deviation. However, it can not be said that this is a good method since there is a trade-off relationship between the number of points to be measured and the throughput of measurement. As seen from the above, stable production of a semiconductor device needs a method of designing an easily-measurable QC pattern whose behavior is equal to a circuit pattern and a method of measuring a dimension on an activation region of that QC pattern with high accuracy and at a high speed.

The present invention has been made to solve the above problems. An object of the present invention is to provide a technique to measure a specific part of a semiconductor device with high accuracy and at a high speed.

SUMMARY OF THE INVENTION

To solve the above problems, the present invention provides a dimension measuring apparatus used for measuring a dimension of a semiconductor device having a first pattern of repeated structure and a second pattern that is linear and formed on the first pattern to extend over the repeated structure. The dimension measuring apparatus comprises: a shape information acquisition means, which acquires information on a shape of the first pattern; a width value acquisition means, which acquires a width value of each portion of the second pattern on a basis of an observation result of the second pattern by a microscope; an analytic area setting means, which sets a plurality of analytic areas on the second pattern such that the analytic areas are adapted for the first pattern's shape acquired by the shape information acquisition means; and a dimension determining means, which extracts, for each of the set analytic areas, width values of portions included in the analytic area in question out of width values acquired by the width value acquisition means, and uses the extracted width values to determine a dimension of the second pattern at portions overlapping the first pattern.

DETAILED DESCRIPTION

Figure 1:
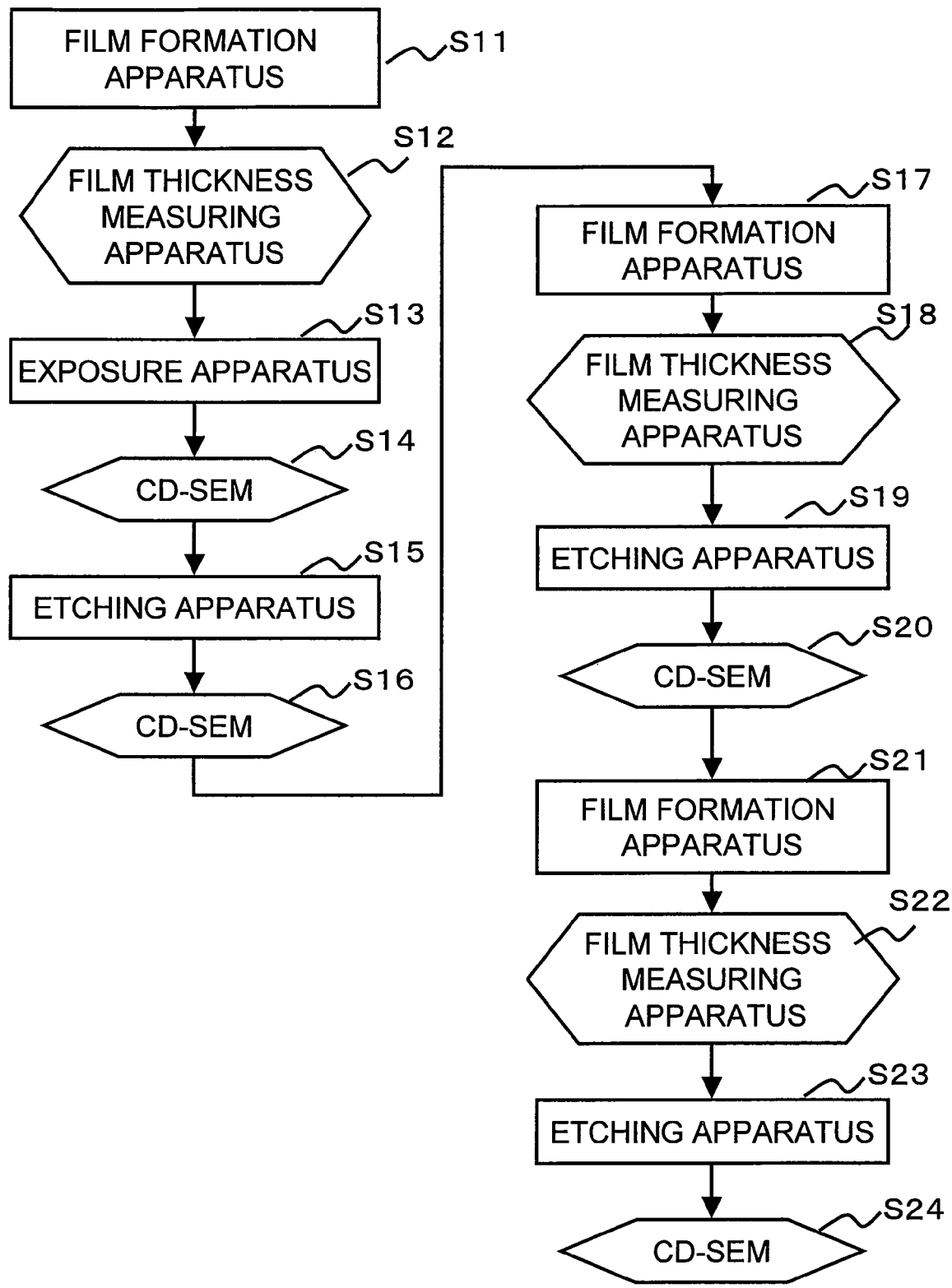
FIG. 1 is a chart showing a gate electrode formation process.

Now, embodiments of the present invention will be described referring to the drawings.

First Embodiment

FIG. 1 is a chart showing a gate electrode formation process in manufacturing process of a semiconductor device. Manufacturing process of an ordinary semiconductor device comprises a fabrication process and a test process including measurement. In FIG. 1, each process is shown by an apparatus (for example, a film formation apparatus, a film thickness measuring apparatus, an exposure apparatus, a CD-SEM, an etching apparatus, and the like) used in that process.

Figure 2:
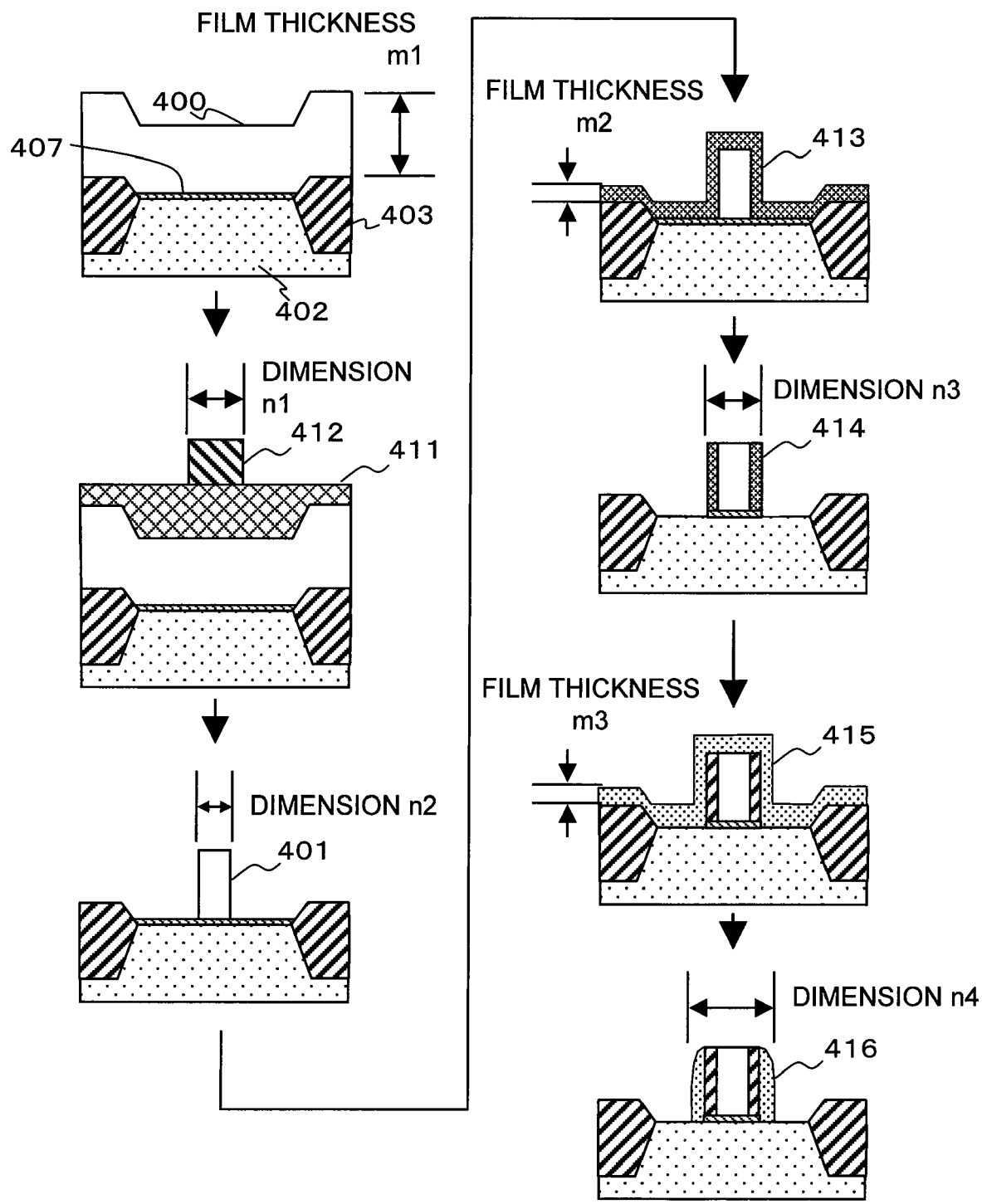
FIG. 2 is a cross section showing a semiconductor device in the gate electrode formation process.

FIG. 2 shows cross sections of a semiconductor device in the gate electrode formation process. In the gate electrode formation process, at first, a film formation apparatus is used to form polycrystalline silicon film 400 (which becomes a gate electrode 401) on a substrate in which an element isolation region 403 and a gate oxide film 407 are formed on an activation region 402 (S11). Next, using a film thickness measuring apparatus, the film thickness m1 of the polycrystalline silicon 400 is measured (S12). Next, using an exposure apparatus, antireflection film 411 is applied. After that, a resist material is applied and a circuit pattern is exposed to form a resist pattern 412 (S13).

Next, the dimension n1 of the resist pattern 412 is measured by a CD-SEM (S14). Next, an etching apparatus is used to perform etching while using the resist pattern 412 as a mask, and thereafter, the remaining resist pattern 412 and the antireflection film 411 are removed (S15).

Here, the dimension n2 of the gate electrode 401 is measured by the CD-SEM (S16). Next, using the film formation apparatus, oxide film 413 is formed (S17), and the film thickness m2 of the oxide film 413 is measured by the film thickness measuring apparatus (S18). Next, using the etching apparatus to etch the oxide film 413 to form an offset spacer 414 (S19). Next, the dimension n3 of the offset spacer 414 is measured by the CD-SEM (S20). Next, the film formation apparatus is used to form silicon nitride film 415 (S21). Next, the film thickness m3 of the silicon nitride film 415 is measured by the film thickness measuring apparatus (S22). Next, the silicon nitride film 415 is etched back by the etching apparatus, to form a Lightly Doped Drain (LDD) spacer 416 (S23). Last, the dimension n4 of the LDD spacer 416 is measured by the CD-SEM (S24).

Next, will be described a method of measuring the dimension n2 of the gate electrode 401 on the activation region 402 by using the CD-SEM.

Figure 3:
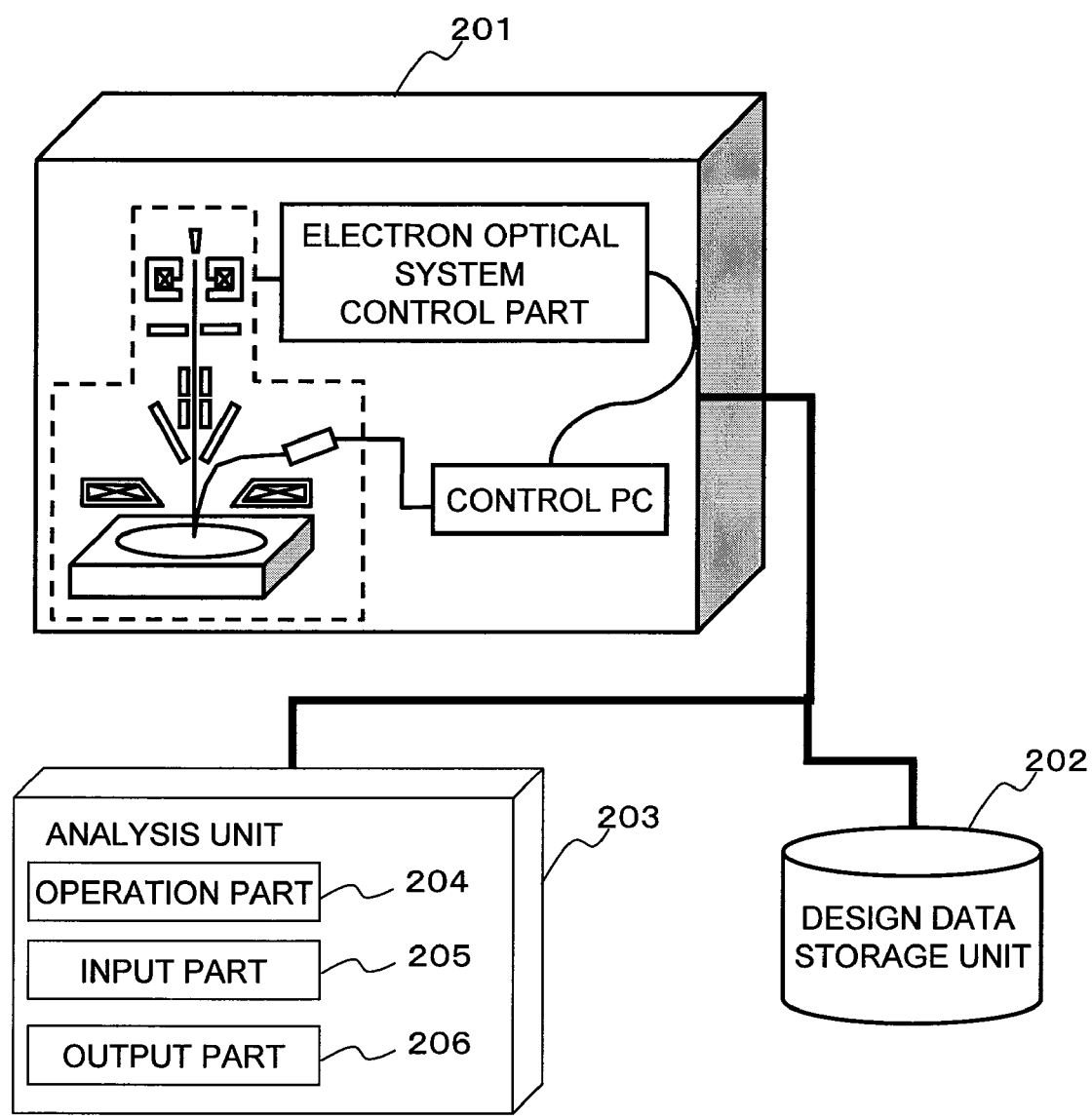
FIG. 3 is a schematic diagram showing a system configuration of a CD-SEM.

FIG. 3 is a diagram showing a schematic configuration of a dimension measuring system (the above-mentioned "CD-SEM") used for measuring dimension. The dimension measuring system comprises: an electron microscope 201 for obtaining a two-dimensional image of an appearance of a semiconductor device; a design data storage unit 202 for storing design data of the semiconductor device; and an analysis unit 203 for obtaining a dimension of a desired part of the semiconductor device. The electron microscope 201 comprises an electron optical system, an electron optical system control part and a personal computer for control. The personal computer for control sends obtained image data to the analysis unit 203.

The analysis unit 203 analyzes an image obtained from the electron microscope 201, obtains the dimension of a desired part of a semiconductor device, and outputs the result. To that end, the analysis unit 203 comprises an operation part 204, an input part 205 and an output part 206. The operation part 204 performs various kinds of processing such as measurement of a width of a specific part of a semiconductor device in response to a request from an operator. The input part 205 comprises a keyboard, a mouse and the like, and receives a request from the operator, and sends the received request to the operation part 204. The output part 206 comprises an output unit such as a display, a printer and the like, and outputs operation results of the operation part 204 to the operator.

The analysis unit 203 can be implemented by a general-purpose computer comprising a Central Processing Unit (CPU), a memory, an interface with external apparatuses, and the like. The design data storage unit 202 is a storage unit such as a hard disk, and functions as an auxiliary storage for the analysis unit 203.

The analysis unit 203 can obtain image data from the electron microscope 201 through a network. Also, the analysis unit 203 can obtain image data through a portable recording medium.

The below-described processing by the operation part 204 can be realized when the CPU executes programs loaded into prescribed areas of the memory. To that end, the memory stores programs for performing prescribed processing.

Figure 4:
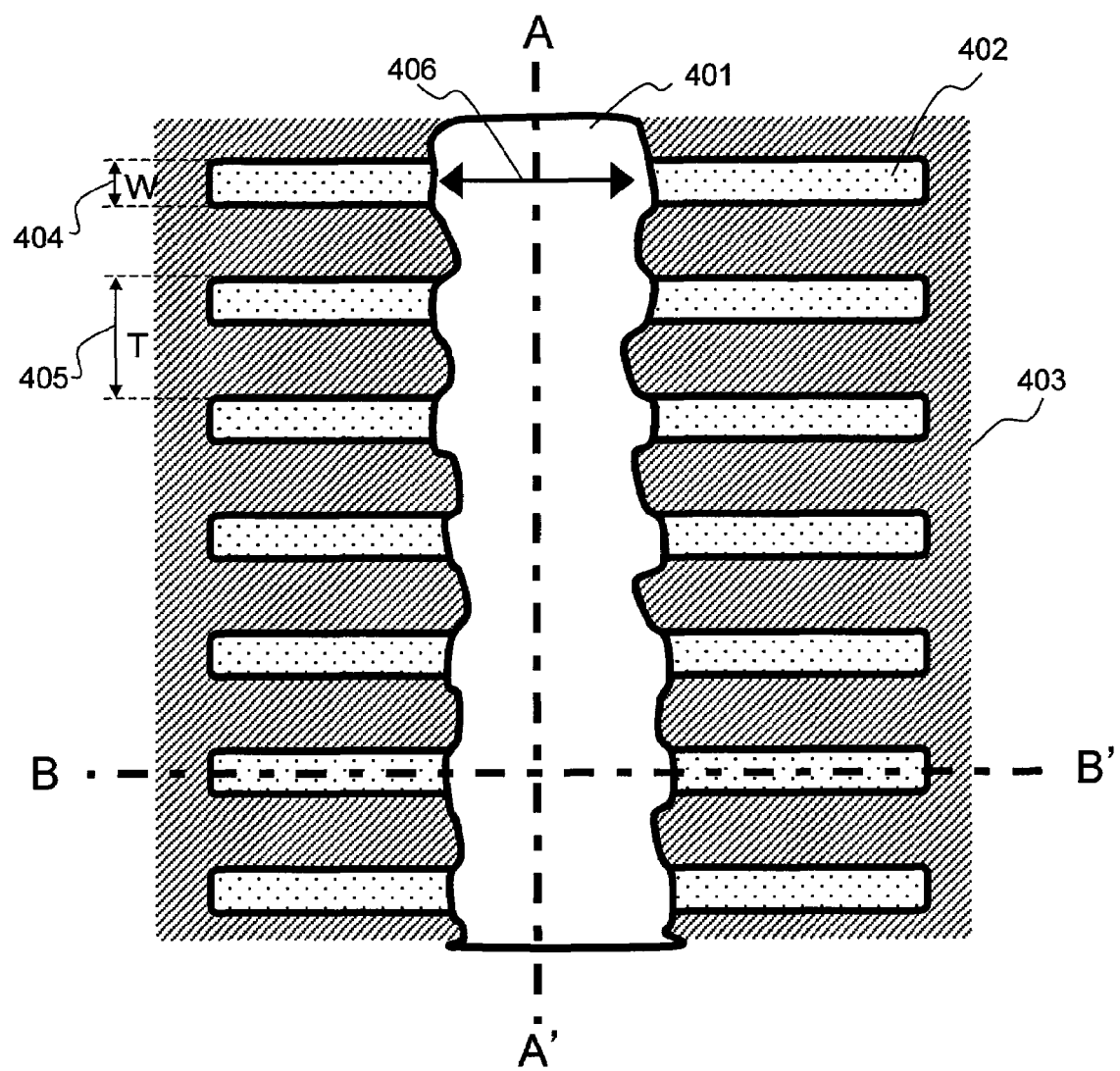
FIG. 4 is a diagram showing a wiring image of a gate electrode including a plurality of activation regions.

Now, description will be given taking an example where the activation region 402 is periodically arranged in an element isolation region 403 as shown in FIG. 4, a top view of a semiconductor device. As shown in the figure, the activation region 402 has a plurality of band regions arranged parallel at prescribed intervals. In other words, the activation region 402 is constructed as a repeated pattern, one unit of which is a band-shaped region. In an upper layer to the activation region 402, a gate electrode 401 of a line shape (band shape) is positioned to extend over the periodic structure (i.e. the repeated pattern) of the activation region 402. The gate electrode 401 in the upper layer is at right angles to the activation region 402 in the lower layer.

The activation region 402 is hollow in relation to the element isolation region 403. Owing to this hollowness, linewidth 406 of the gate electrode 401 is thicker at portions overlapping with the activation region 402 in comparison with portions overlapping with the element isolation region 403.

In the following, will be described a case of calculating the wiring dimension 406 of the gate electrode 401 on the activation region 402 in a semiconductor device having such structure.

Here, the width 404 in the transverse direction of the activation region 402 and the pitch 405 of the activation region 402 are indicated by W and T respectively. The pitch T is the length obtained by adding the width W to the distance between adjacent band-shaped regions of the activation region 402.

Figure 5A:
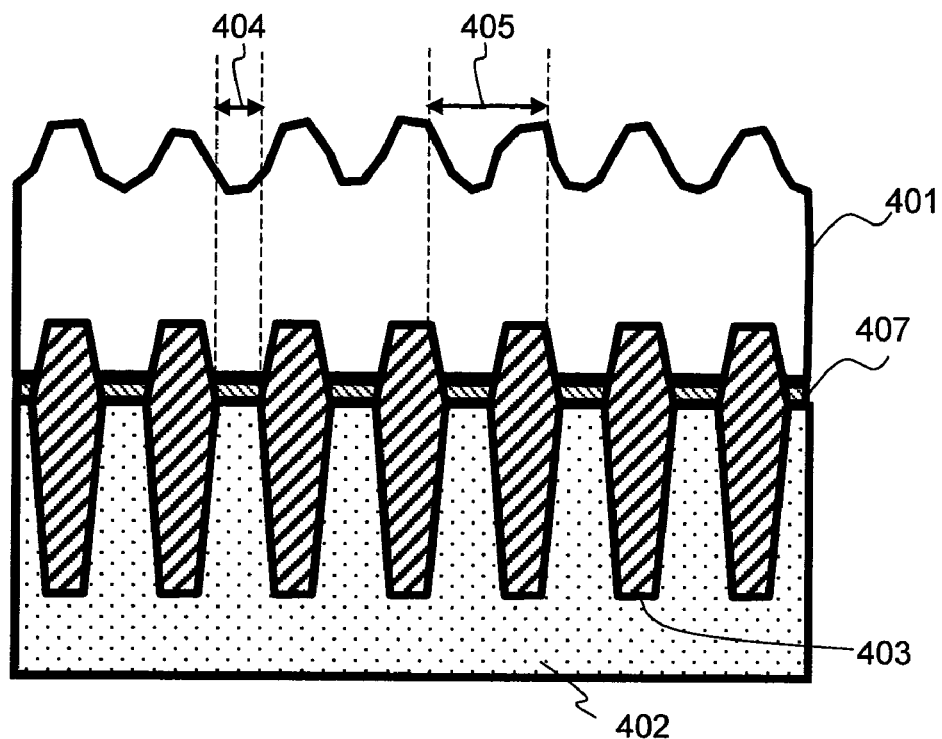
FIG. 5(A) is a cross section of the gate electrode taken along the A-A' line, and FIG. 5(B) a cross section of the gate electrode taken along the B-B' line.
Figure 5B:
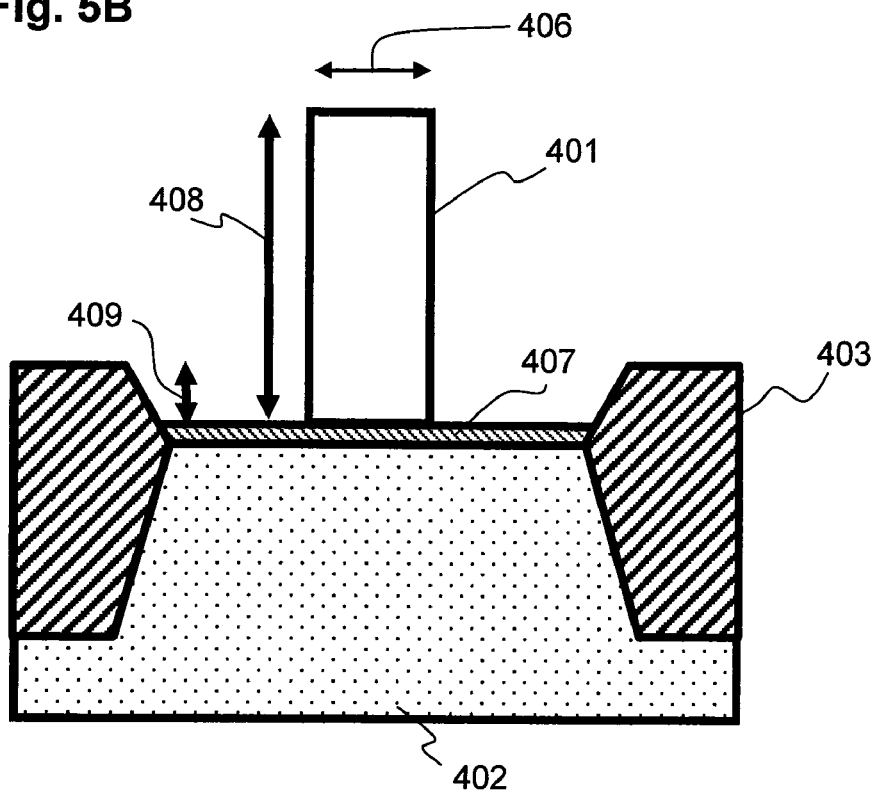

FIG. 5(A) shows a cross section in the longitudinal direction of this gate electrode 401 (A-A' cross section in FIG. 4), and FIG. 5(B) a cross section in the longitudinal direction of the activation region 402 (B-B' cross section in FIG. 4).

In the A-A' cross section, the activation region 402 and the element isolation region 403 are repeated at intervals of the pitch T, and thus there are periodic steps. Synchronously with these steps, the surface of polycrystalline silicon as the gate electrode 401 becomes rugged.

In the B-B' cross section, the gate oxide film 407 exists under the gate electrode 401 on the activation region 402.

In the wiring dimension calculation processing described in the following, a representative value of width is obtained from widths of various parts of the gate electrode 401 on the activation region 402, to determine the wiring dimension 406.

Figure 6:
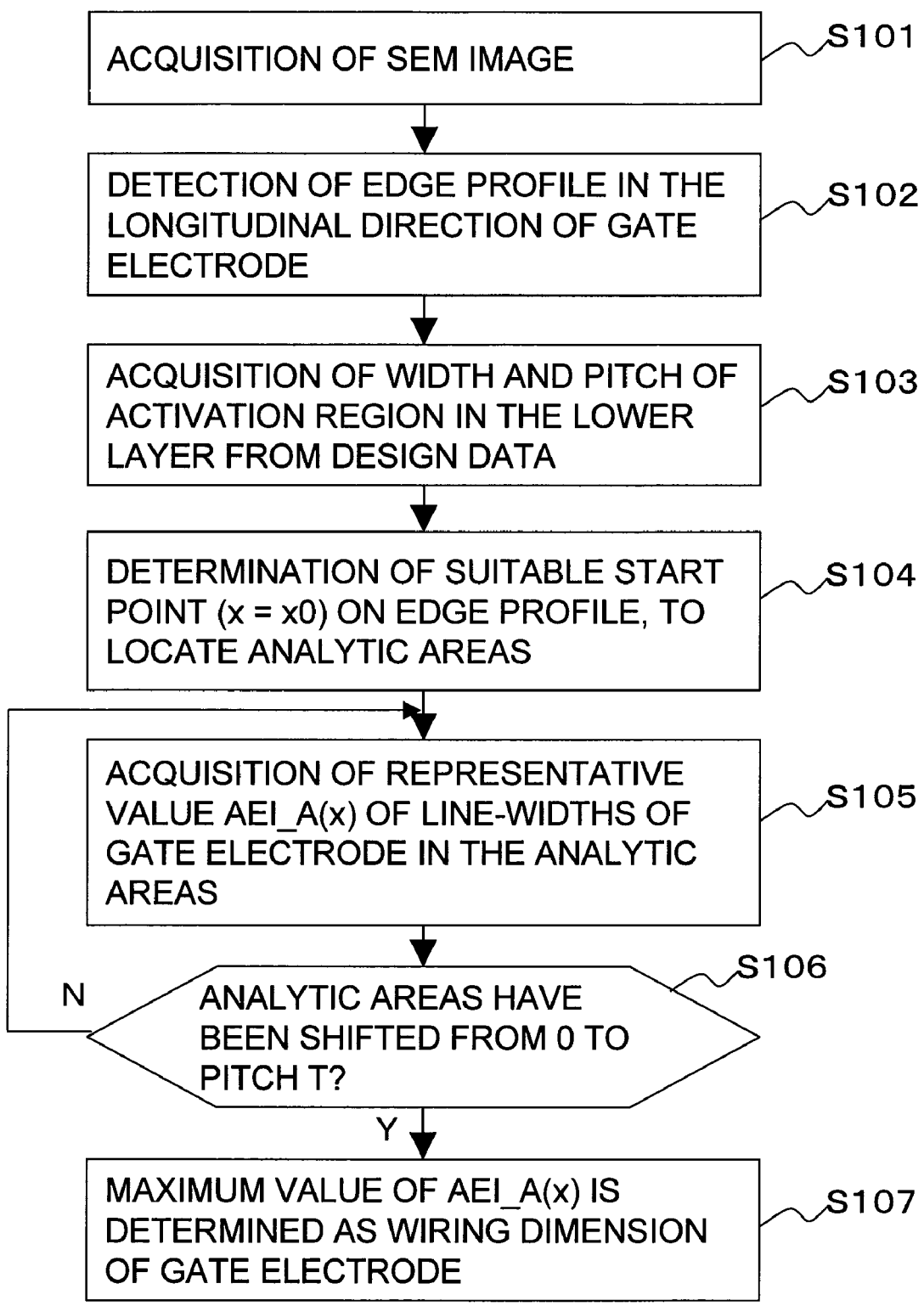
FIG. 6 is a flowchart showing activation region wiring dimension calculation processing (a first embodiment)
Figure 7:
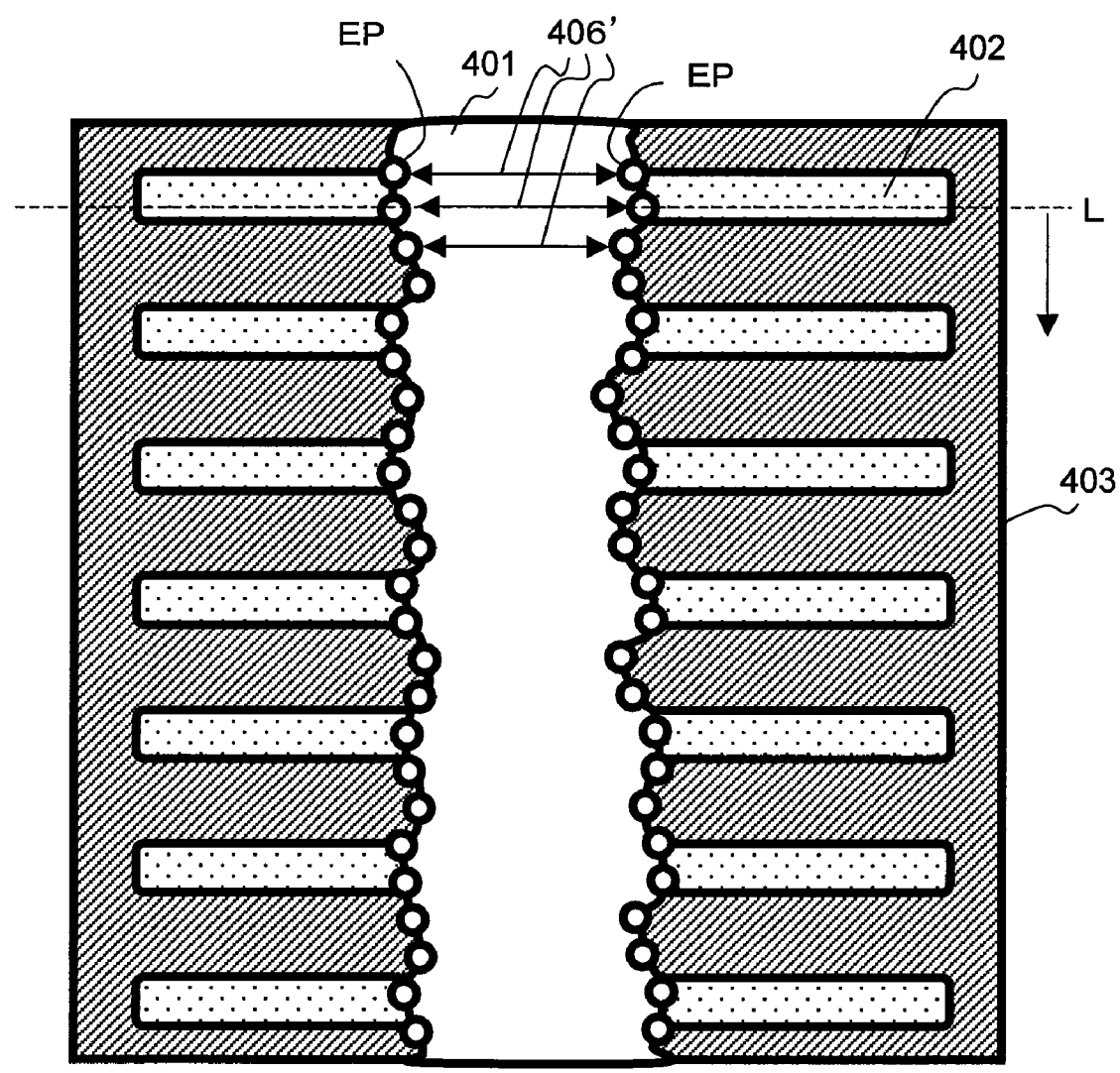
FIG. 7 is a diagram for explaining a method of obtaining an edge profile of a gate electrode.

FIG. 6 is a chart showing a flow of the processing of calculating the wiring dimension 406 of the gate electrode 401 on the activation region 402. FIG. 7 shows an example of an image obtained by the electron microscope 201.

First, the operation part 204 obtains an image (as shown in FIG. 7) of the neighborhood of the gate electrode 401 from the electron microscope 201 (S101). At that time, it is favorable that the operation part 204 obtains an image such that the image includes 2 μm or more of the length of the gate electrode 401 in the longitudinal direction. In that case, the number of samples (the number of the below-mentioned edge points EP) becomes sufficient, and the wiring dimension 406 can be obtained with high accuracy.

Next, the operation part 204 detects edge points EP in the transverse direction of the gate electrode 401 (S102). In detail, the operation part 204 determines a line L in the transverse direction of the gate electrode 401 on the image 403, and obtains, as edge points EP, intersections of the line L and the edges of the gate electrode 401. Since the gate electrode 401 has some width, two edge points EP are obtained on the same line L. Then, the operation part 204 obtains a distance between the two edge points EP on the same line L, and determines the obtained distance as the line-width 406' of the gate electrode 401 at that portion. The operation part 204 performs this processing while shifting the line L by a prescribed interval of a small distance from the one end (the initial position) of the image 403 to the other end. Thus, the operation part 204 obtains the line-width 406' (the distance between edge points EP) at each portion of the gate electrode 401 in the longitudinal direction. Then, the operation part 204 generates a data string (referred to as an "edge profile") by associating a location from the initial position of the gate electrode 401 with the line-width 406' obtained at that location.

Here, it is favorable that the operation part 204 obtains edge points EP at intervals of 10 nm or less in the longitudinal direction of the gate electrode 401. To that end, the above-mentioned line L for obtaining edge points EP is shifted on the image by an interval of 10 nm or less.

Figure 8:
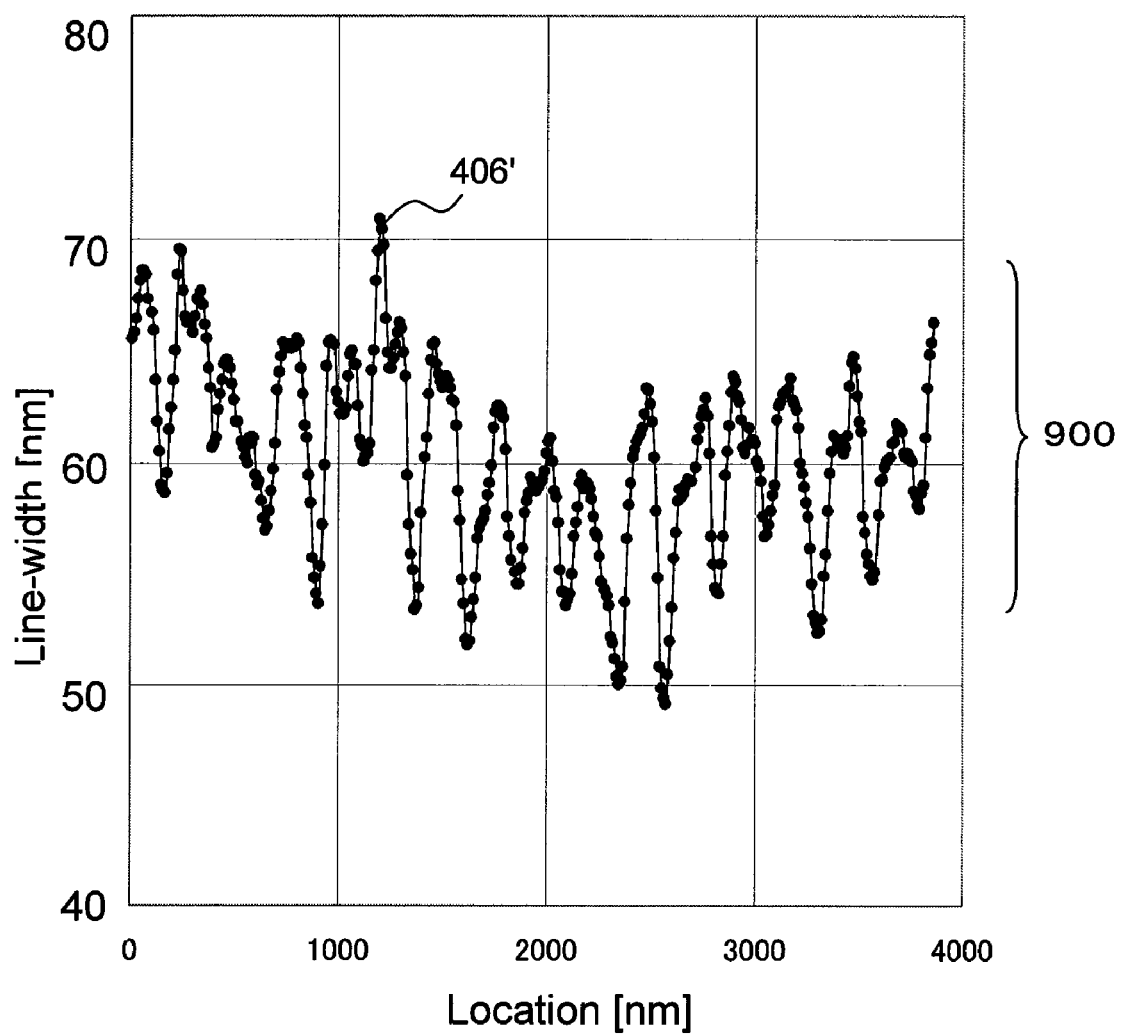
FIG. 8 is a diagram showing an edge profile of line-widths of a gate electrode.

FIG. 8 shows an edge profile 900 obtained actually by an experiment. It is obviously shown that the line-width 406' (distance between edge points EP) of the gate electrode 401 fluctuates at a synchronous pitch with the width W and the pitch T of the activation region 402 in the lower layer.

Next, the operation part 204 obtains design data including the width W and the pitch T of the activation region 402 from the design data storage unit 202 (S103). Here, the operation part 204 may receive the design data from the operator through the input part 205. For example, the width W and the pitch T may be received as number input on a display screen. Or, an image of the neighborhood of the gate electrode 401 such as the image shown in FIG. 7 may be displayed on a display, and drawing of a rectangle by cursor operation on the image is received, so that the length corresponding to the width of the drawn rectangle is received as the width W of the activation region 402. Further, drawing of two rectangles may be received so that the length corresponding to the pitch between those rectangles is received as the pitch T of the activation region 402.

Figure 9:
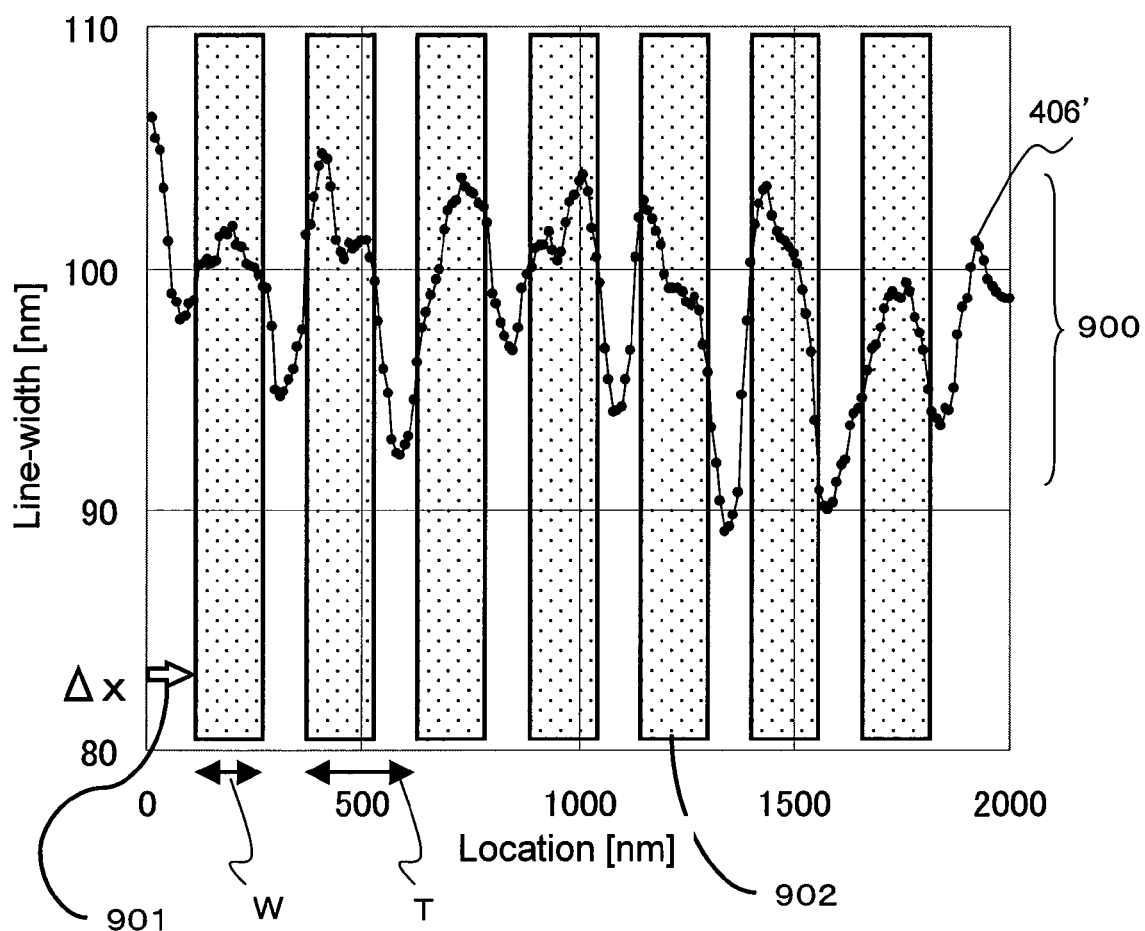
FIG. 9 is a diagram showing a positional relation between a line-width edge profile and analytic areas corresponding to activation regions.

Next, as shown in FIG. 9, the operation part 204 places analytic areas 902 on the edge profile 900, starting from a prescribed initial position ($x=x_0$), i.e. a start point 901 (S104). These analytic areas correspond to the width W and the pitch T of the activation region 402, which have been obtained in S103.

Then, the operation part 204 extracts line-widths 406' included in the analytic areas 902 from the edge profile 900, to calculate a representative value AEI_A ($x=x_0$) of these line-widths 406' (S105). Here, the average value is determined as the AEI_A ($x=x_0$). That is to say, the operation part 204 sums up the extracted values of line-widths 406, and divides the total by the number of the extracted line-widths 406' to obtain the representative value AEI_A ($x=x_0$).

If the positions of the analytic areas 902 coincide with the positions of the actual activation region 402, the above-obtained representative value can be taken as the wiring dimension 406 of the gate electrode 401 on the activation region 402. If, however, the positions of the analytic areas 902 deviate from the positions of the actual activation region 402, it is not appropriate that the above-obtained representative value should be the wiring dimension 406 of the gate electrode 401 on the activation region 402.

Thus, the operation part 204 obtains representative values AEI_A while shifting the positions of the analytic areas 902 by a prescribed interval. Then, using the obtained representative values AEI_A, the operation part 204 determines the wiring dimension 406 of the gate electrode 401 on the activation region 402 according to a previously-determined method.

Here, it is assumed that the operation part 204 determines, as the wiring dimension 406, the maximum value of the obtained representative values AEI_A.

In detail, first the operation part 204 determines a shift amount $\Delta x$ of the analytic areas 902 from the initial position $x_0$ within the limit of the pitch T. Then, the operation part 204 shifts the start point 901 of the analytic areas 902 by $\Delta x$, to place the analytic areas 902 again. Then, similarly to the above, the operation part 204 extracts line-widths 406' included in the analytic areas 902 and calculates the representative value AEI_A ($x=x_0+\Delta x$). This processing is performed by the number of setting values of $\Delta x$, to obtain the representative value AEI_A ($x=x_0+\Delta x$) for each value of the shift amount $\Delta x$ (S106).

Here, it is favorable that the operation part 204 sets Δx to a value that is 50% or less of the intervals of the edge points EP (here, the intervals in the longitudinal direction of the gate electrode 401).

Figure 10:
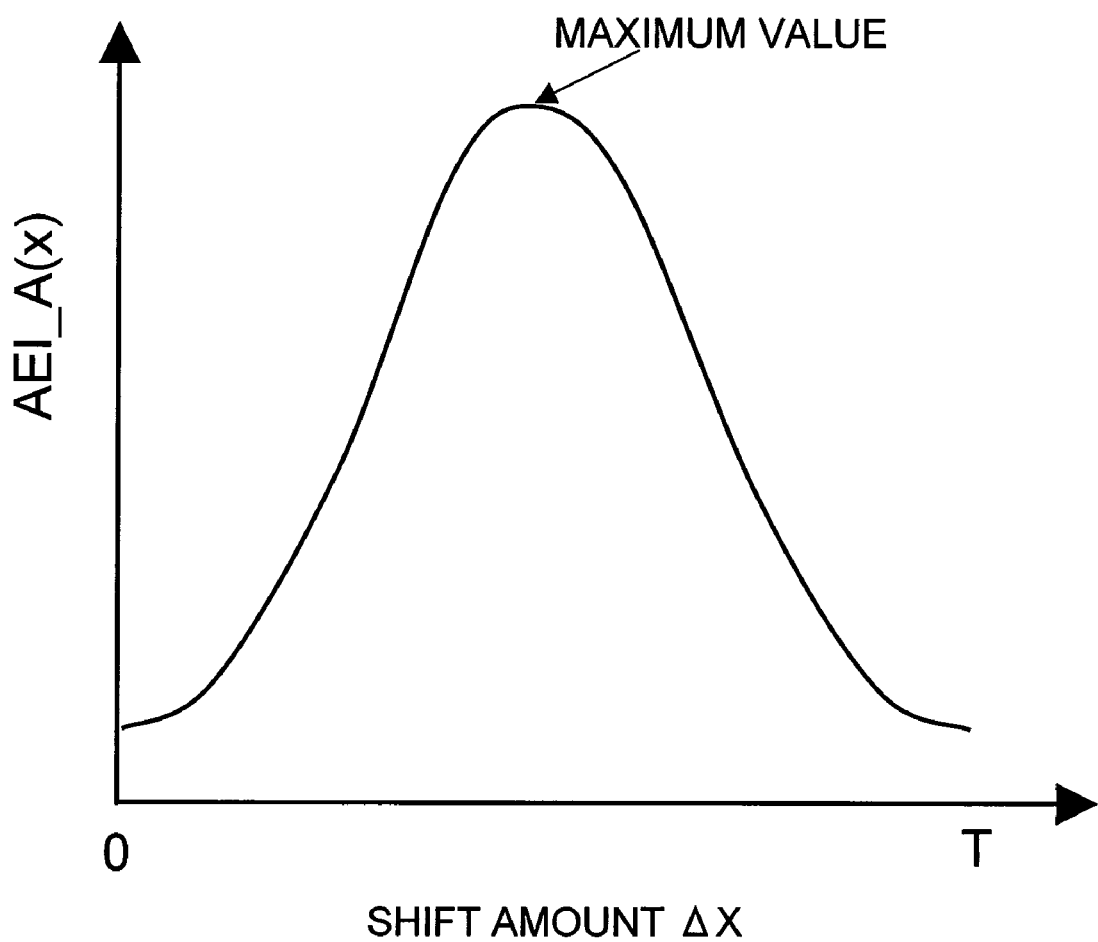
FIG. 10 is a diagram showing a characteristic curve (a relation between a shift amount $\Delta x$ of analytic areas and a representative value $AEI\_A(x)$)

FIG. 10 shows a thus-obtained relation (hereinafter, also referred to as a "characteristic curve") between the shift amount Δx and the representative value AEI_A. In the case where the positions of the analytic areas 902 deviate from the actual activation region 402, line-widths 406' on the element isolation region 403 (which are narrower than the line-widths 406' on the activation region 402) are included in the calculation of the representative value AEI_A. Thus, the representative value AEI_A, i.e. the average value, is smaller than the accurate dimension. Such a representative value AEI_A should not be employed as the wiring dimension 406 of the gate electrode 401 on the activation region 402.

On the other hand, in the case where the positions of the analytic areas 902 coincide with the positions of the actual activation region 402, it is expected that the representative value AEI_A, i.e. the average value, will become the maximum value in the graph of FIG. 10. In other words, it is appropriate that the maximum value of the representative value AIE_A as the average value is determined as the wiring dimension 406 of the gate electrode 401 on the activation region 402.

From the viewpoint of numerical analysis, Δx is set to values between 0 and T, and the maximum value of the representative value AEI_A as the average value is obtained. Of course, values may be reversed so that the problem is converted to a problem of obtaining the minimum value. The result is equivalent in that Δx for which the analytic areas coincide with the actual activation region is obtained.

Thus, the operation part 204 determines the maximum value of the representative values AEI_A as the wiring dimension 406 of the gate electrode 401 on the activation region 402 (S107).

Here, in obtaining the maximum value of the representative values AEI_A, it is favorable that the operation part 204 sets Δx to all over the area of the pitch T, to perform analysis. However, to reduce the computation load, it is more favorable to apply a numerical analysis method such as Newton method. Finally, this maximum value is determined as the wiring dimension 406 on the activation region 402.

Hereinbefore, the processing of obtaining the wiring dimension 406 the gate electrode 401 at the portions on the activation regions 402 has been described.

Thereafter, the operation part 204 displays the obtained wiring dimension 406 on the display unit through the output part 206.

Figure 11:
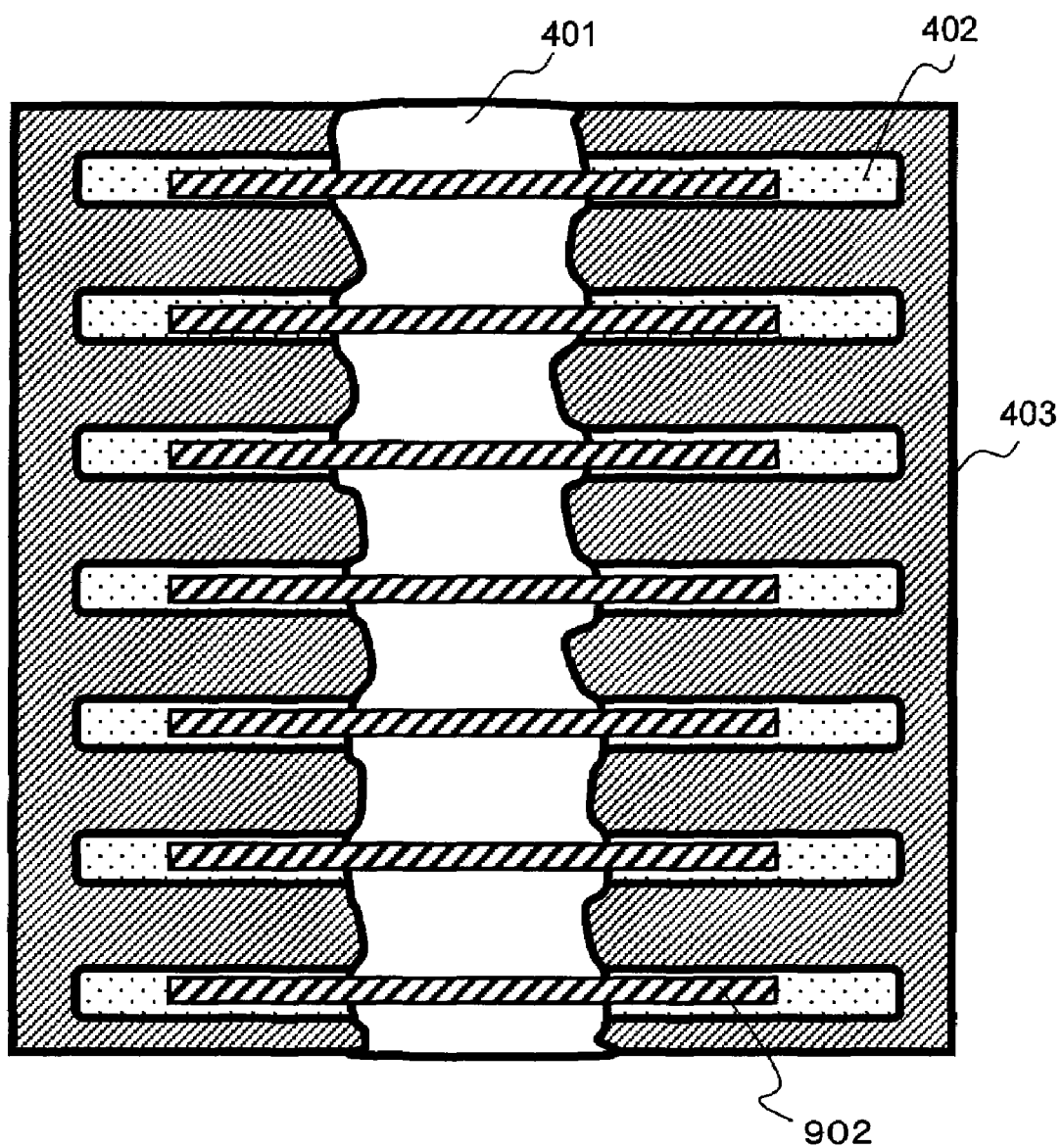
FIG. 11 is a diagram showing an arrangement of analytic areas 902.

Further, the operation part 204 displays prescribed information so that a user can judge whether the obtained wiring dimension 406 is appropriate or not. For example, as shown in FIG. 11, the operation part 204 displays the analytic areas 902 leasing to the representative value AEI_A employed as the wiring dimension 406, superimposing the analytic area 902 on the microscope image (the image shown in FIG. 4). In other words, the operation part 204 displays areas determined by the width W, the pitch T and the shift amount Δx corresponding to the analytic areas 902 leading to the maximum value of the representative value AEI_A, to be superimposed on the microscope image.

Hereinabove, the first embodiment has been described.

According to the first embodiment, it is possible to obtain the wiring dimension 406 of the gate electrode 401 on the activation region 402 by a simple method, with high accuracy and at a high speed.

Figure 12:
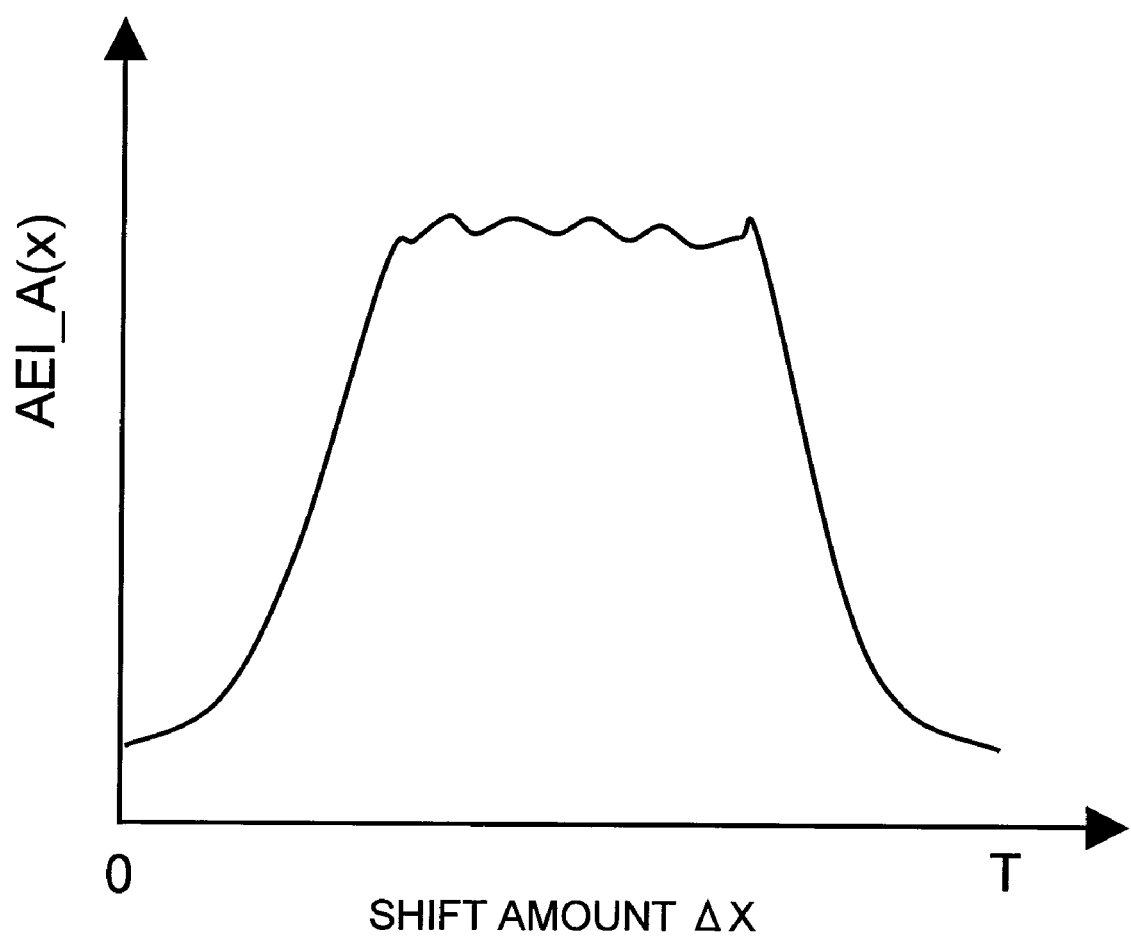
FIG. 12 is a diagram showing a characteristic curve having a gentle peak.
Figure 13:
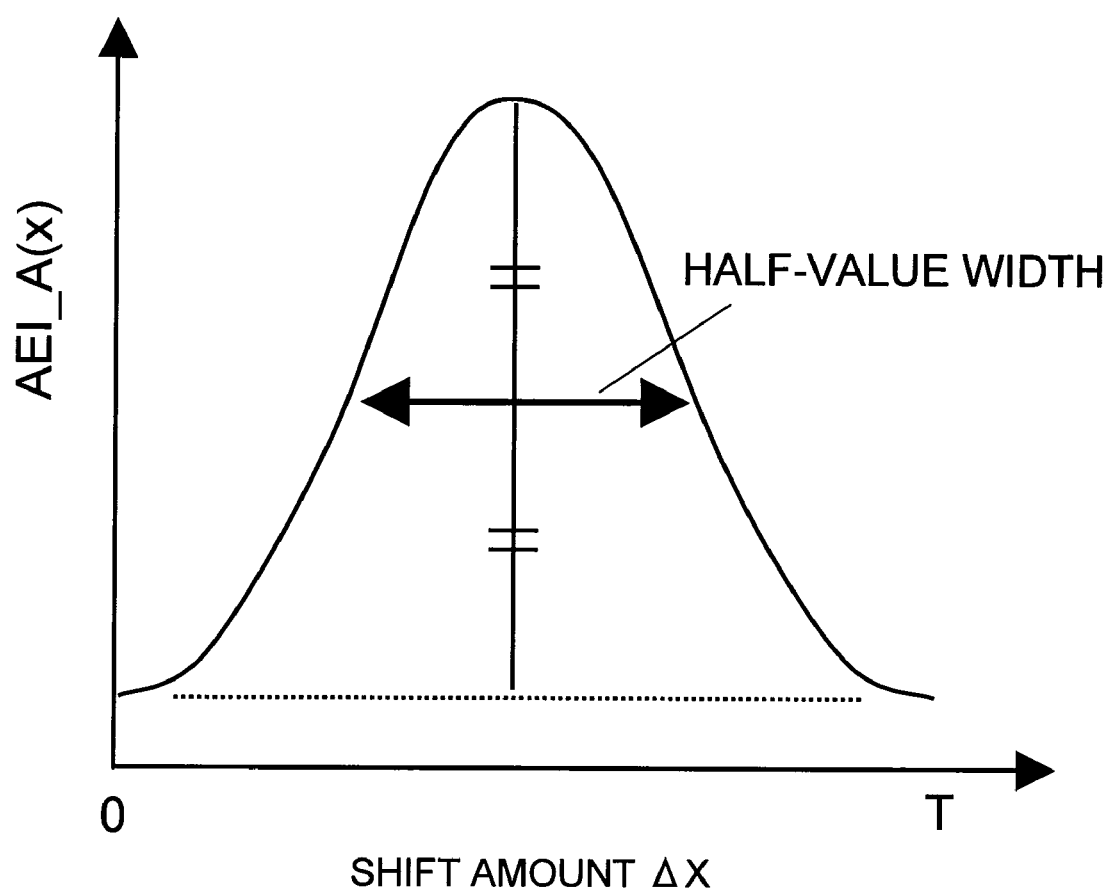
FIG. 13 is a diagram showing a half-value width of a characteristic curve.

In the case where the width W of each analytic area 902 is narrower, the characteristic curve (the relation between the shift amount Δx and the representative value AEI_A) is not like that shown in FIG. 10, and has a wide peak as shown in FIG. 12. In this case, it is a problem which point should be determined as the maximum value. Thus, in the case where the width W of a analytic area 902 is narrower than a prescribed width, then as shown in FIG. 13, it is favorable that the operation part 204 confirms the setting of the width W of the analytic area 902 and the pitch T by using the half-value width of the characteristic curve as a parameter. In detail, when the half-value width is more than or equal to a prescribed value, or when a ratio of the half-value width to the pitch T is more than or equal to a prescribed value, then the operation part 204 displays a message to the effect that the width W of the analytic area 902 and the pitch T are inappropriate. As a result, the user can consider the appropriateness of the input values or the appropriateness of the calculated wiring dimension 406.

Further, when the width W and the pitch T of the activation region 402 are received from the user, the operation part 204 may display the wiring dimension 406 obtained by using those values W and T and the wiring dimension 406 obtained not by using those values W and T but by using the width W and the pitch T stored in the design data, such that both wiring dimensions 406 can be compared with each other.

Figure 14A:
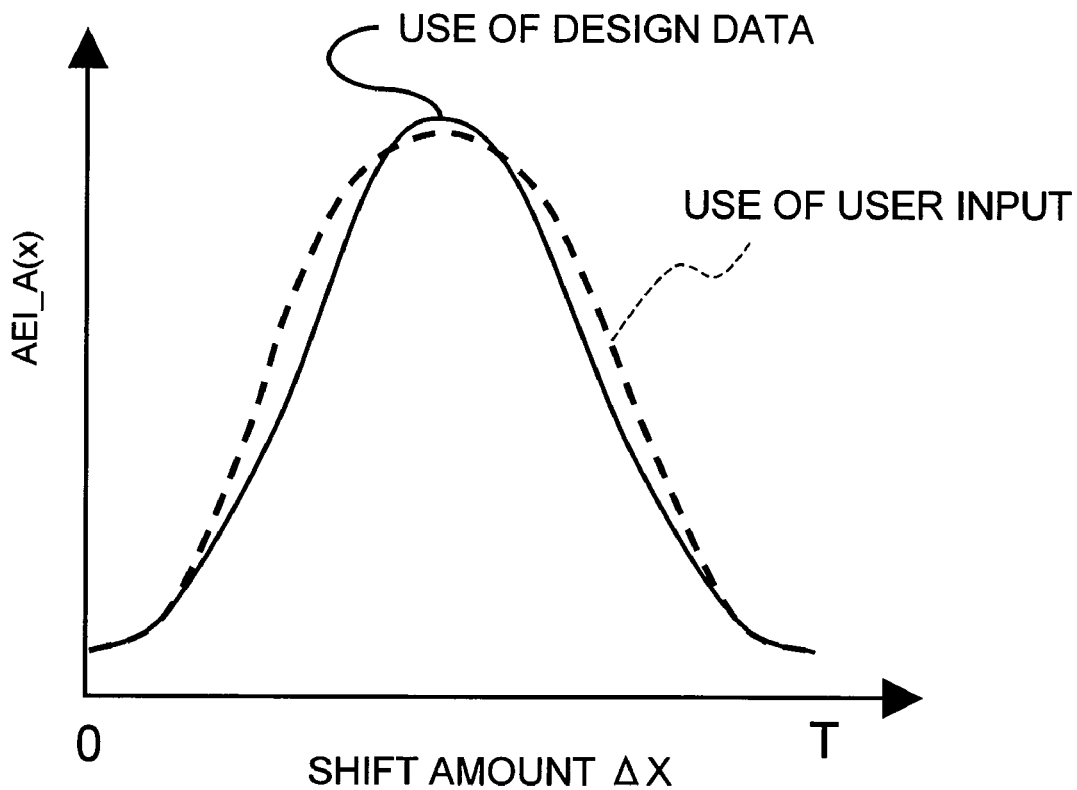
FIG. 14(A) is a diagram showing a characteristic curve in the case of using user input values and a characteristic curve in the case of using design data.
Figure 14B:
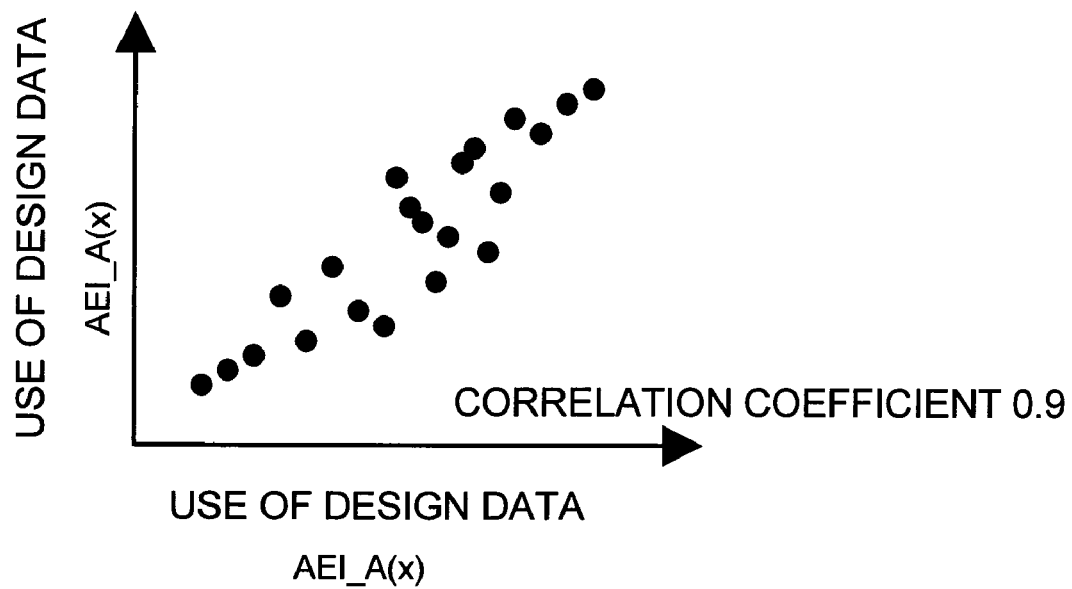
FIG. 14(B) is a diagram showing a degree of correlation between them.

In detail, the operation part 204 obtains the characteristic curve (the relation between the shift amount Δx and the representative value AEI_A) for each case, and displays both curves on the display unit as shown in FIG. 14(A). Further, the operation part 204 may use similarity of the two characteristic curves in order to inspect the appropriateness of the user input values. For example, as shown in FIG. 14(B), a correlation coefficient of the respective characteristic curves in those cases is used as an index. And, when the correlation coefficient does not belong to a previously-determined range (for example, 0.9-1.0), then the operation part 204 judges that the input values are not appropriate, and displays a message to that effect.

Further, the operation part 204 may perform the analysis again when the correlation coefficient is less than or equal to a previously-determined value (for example, 0.9). For example, input of the width W and the pitch T of the activation region 402 is received again from the user, and the calculation is performed again. Or, an average of the respective maximum values of the two characteristic curves may be obtained and determined as the wiring dimension 406.

Further, in the above description, the representative value AEI_A is determined by the average value of the line-widths 406'. However, a method of obtaining the representative value AEI_A is not limited to this.

For example, the maximum value or the minimum value of line-width 406 in the analytic areas 902 may be determined as the representative value AEI_A. Or, the average of the maximum value and the minimum value may be determined as the representative value AEI_A.

Or, it is possible to determine, as the representative value AEI_A, the standard deviation (generally called Line Width Roughness) of line-widths 406' in the analytic areas 902 or the standard deviation (generally called Line Edge Roughness) of coordinates of edge points EP in the analytic areas 902.

On which of the methods should be used to obtain the representative value, the operation part 204 may receive an instruction from the user through the input part 205 and set the instructed method.

Here, the description has been given taking the example where the dimension n2 of the gate electrode 401 of FIG. 2 is measured (S16 in FIG. 1). However, a similar technique can be applied to the measurement (S20 of FIG. 1) of the dimension n3 of the offset spacer 414 or the measurement (S24 of FIG. 1) of the dimension n4 of the LDD spacer 416.

Further, as shown in FIG. 5(b), the present embodiment has been described with respect to the case where the element isolation region 403 is higher than the activation region 402 owing to the steps 409. However, the present invention is effective for the reverse case. If the element isolation region 403 is lower than the activation region 402, the dimension on the activation region 402 becomes narrower than that on the element isolation region 403. In such a case, the operation part 204 determines the minimum value of the average values AEI_A obtained as described above, as the wiring dimension of the gate electrode 401 on the activation region 402.

Further, the present embodiment has been described taking the example where the dimension of a gate electrode of a planar-type transistor is measured. However, the present embodiment can be applied to measurement of a line-width in a three-dimensional type transistor such as a Fin-FET. Particularly, the present embodiment is effective in measuring a gate length extending over a plurality of activation regions called Multi-Fin.

Second Embodiment

A second embodiment has a configuration similar to that of the first embodiment, and description of the common parts will be omitted.

In manufacturing process of an actual semiconductor device, sometimes the width W or the pitch T of an activation region becomes different from design data owing to fluctuation in a fabrication process or fluctuation in an exposure process. When the above-described first embodiment is directly applied to such a case, there occurs deviation from an accurate dimension toward a narrower dimension since dimensions on the element isolation region (where line-width is narrower) are included in the processing of averaging. For this reason, it is desirable to optimize the width W and the pitch T of the activation region. Here, will be described a method of measuring a dimension of a gate electrode on an activation region with high accuracy even when the width W and the pitch T are different from design data.

Figure 15:
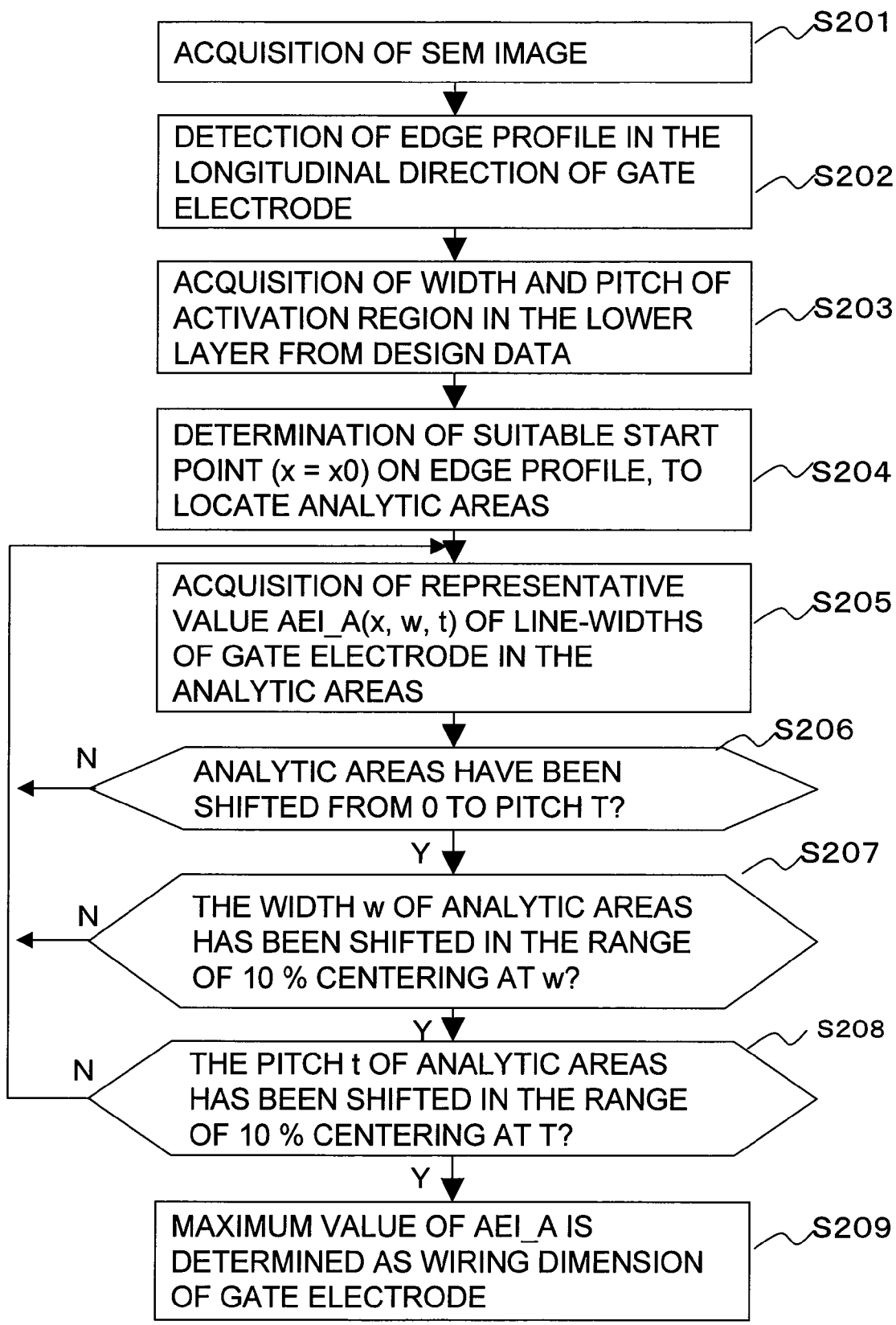
FIG. 15 is a flowchart showing activation region wiring dimension calculation processing (a second embodiment)

FIG. 15 is a flowchart showing a flow of wiring dimension calculation processing in such a case. Processes in S201-S204 are similar to those in S101-S104 of the first embodiment.

In the present embodiment, the operation part 204 obtains the representative values (here, the average values) AEI_A not only by shifting the positions of the analytic areas 902 but also by shifting the width W and the pitch T of the analytic areas 902 within a prescribed range (here, a range of 10% in either direction).

In detail, first the operation part 204 sets the width w of the analytic areas 902 to the value of the width W of the design data−10%. Further, the operation part 204 sets the pitch t of the analytic areas 902 to the value of the pitch T of the design data−10%.

Then, similarly to the above-described first embodiment, the operation part 204 obtains a representative value AEI_A corresponding to a shift amount $\Delta x$ (S205) while shifting the start point 901 of the analytic areas 902 having the set width w and set pitch t by the shift amount $\Delta x$ from the initial position ($x=x_0$) up to the position ($x=x_0+t$) corresponding to the pitch t (Yes in S206).

When the operation part 204 finishes shifting the start point 901 of the analytic areas 902 by the pitch t (Yes in S206), then the operation part 204 increases the width w of the analytic areas 902 by a prescribed amount. Then, performing the processes of S205 and S207, a representative value AEI_A corresponding to the shift amount $\Delta x$ and the set width w is obtained. Such processing is repeated while the width w does not exceed the width W of the design data+10% (No in S207).

When the width w exceeds the width W of the design data+10% (Yes in S207), the operation part 204 increases the pitch t of the analytic areas 902 by a prescribed amount. Then, the above-described processes S205-S207 are performed. By this, a representative value AEI_A corresponding to the width w, the shift amount $\Delta x$ and the set pitch t is obtained. These processes S205-S207 are repeated while the pitch t does not exceed the pitch T of the design data+10% (No in S208).

When the pitch t exceeds the pitch T of the design data+10% (Yes in S208), the operation part 204 obtains the maximum value of the representative values AEI_A that have been obtained up to that time.

Figure 16:
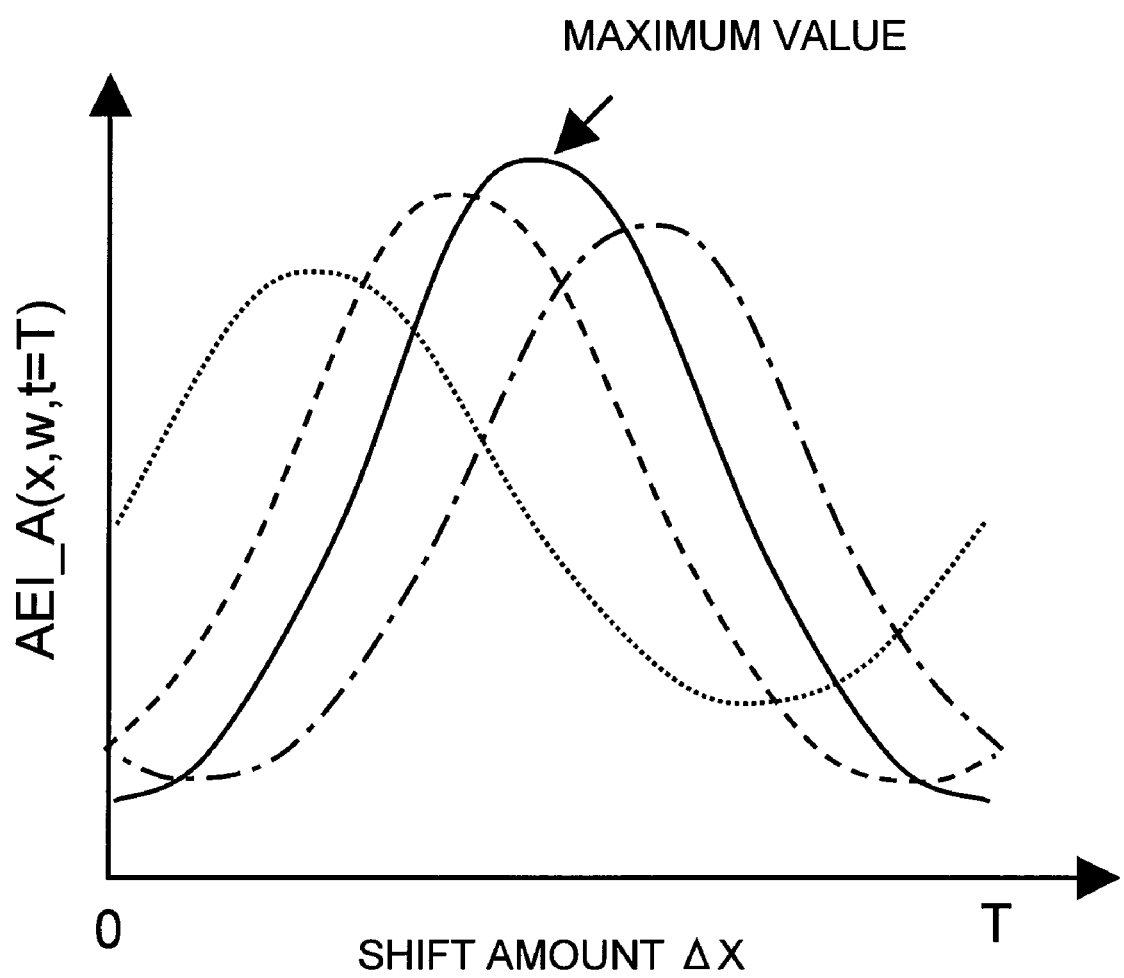
FIG. 16 is a diagram showing examples of a characteristic curve in the second embodiment.

FIG. 16 shows change (characteristic curve) of the thus-obtained representative value AEI_A when the shift amount $\Delta x$, the width w and the pitch t are changed.

The operation part 204 determines the maximum value of the average AEI_A as the wiring dimension 406 of the gate electrode 401 on the activation region 402 (S209).

Hereinabove, the second embodiment has been described. According to the second embodiment, the wiring dimension 406 of the gate electrode 401 on the activation region 402 can be obtained with high accuracy even if the actual activation region 402 deviates somewhat from the design data.

Further, since the calculation is performed assuming that the deviation from the design data is within the prescribed range (in the above example, 10% in either direction), it is possible to prevent obtainment of an unrealistic value of the wiring dimension 406.

Third Embodiment

A third embodiment has a configuration similar to those of the above-described first and second embodiments, and description of the common parts will be omitted.

As the third embodiment, a method of calculating the wiring dimension 406 with more accuracy will be described.

In the above embodiments, only the analytic areas corresponding to the activation region 402 are provided. In comparison with this, the present embodiment provides two kinds of analytic areas, i.e. analytic areas corresponding to the activation region 402 and analytic areas corresponding to the region (the element isolation region 403) that is not the activation region. And, a representative value (here, an average value) in each kind of analytic areas is obtained from line-widths 406' included in that kind of analytic areas. Then, a suitable position of analytic areas is obtained on the basis of a difference between the obtained representative values. Representative value in the analytic areas at that position is used to determine the wiring dimension 406.

Here, is used also the fact that, in the case where the steps 409 (See FIG. 5(B)) of the element isolation region 403 are higher than the activation region 402, line-widths 406 of the gate electrode 402 on the element isolation region 403 become narrower than those 406 on the activation region 402.

Figure 17:
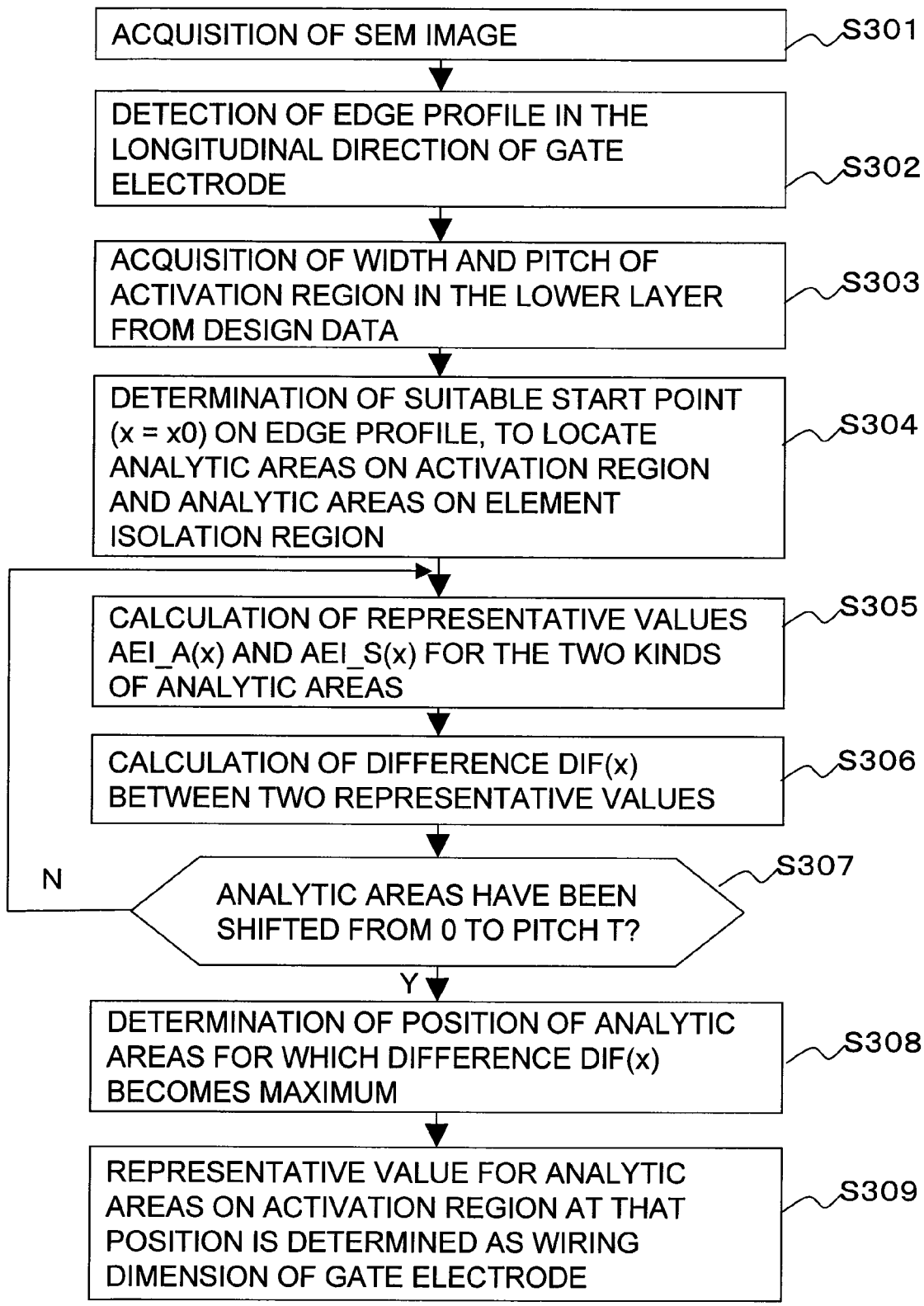
FIG. 17 is a flowchart showing activation region wiring dimension calculation processing (a third embodiment)

FIG. 17 shows a flow of wiring dimension calculation processing in such a case. Processes S301-S304 are similar to the processes S101-S104 of the first embodiment.

Figure 18:
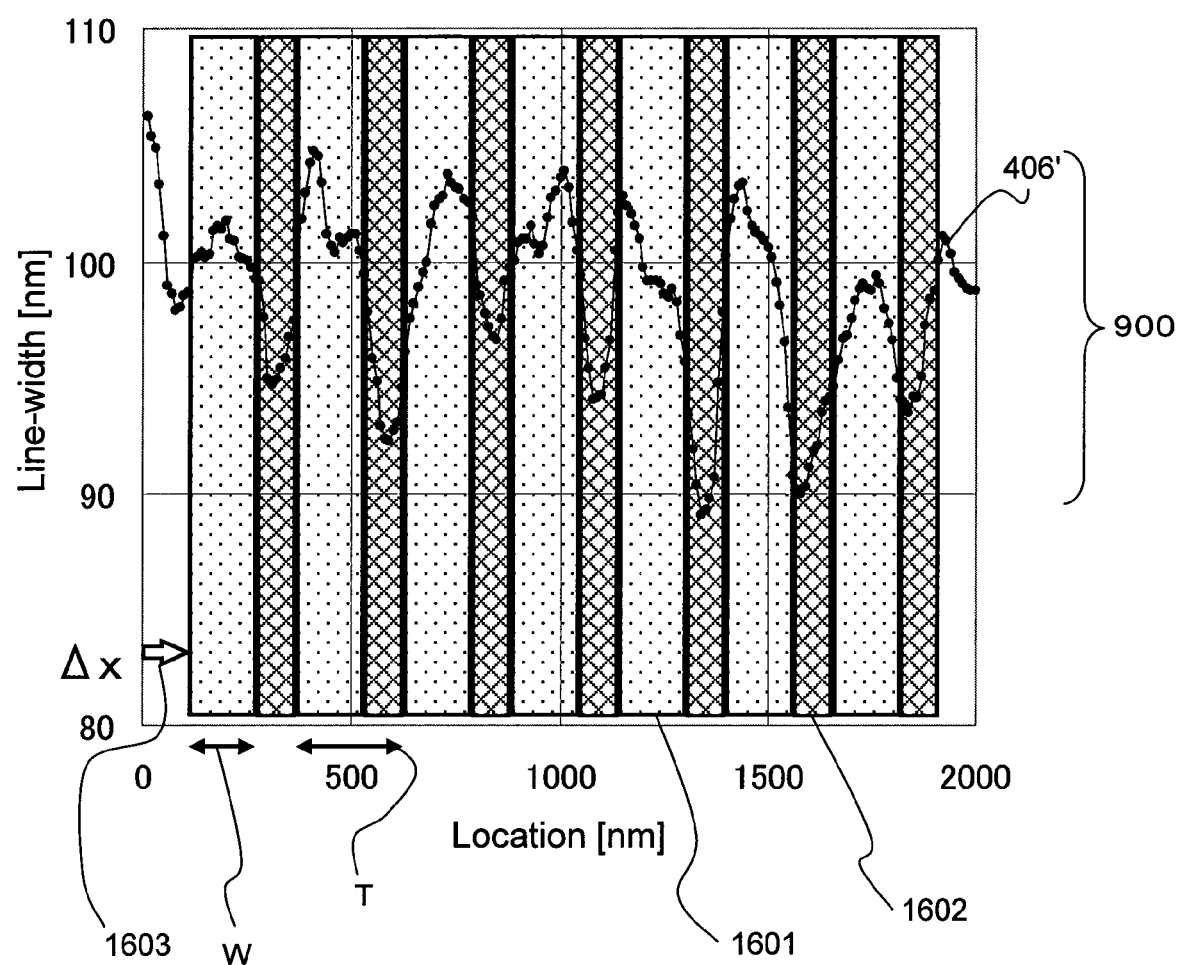
FIG. 18 is a diagram showing an arrangement of analytic areas according to the third embodiment.

In the step S305, as shown in FIG. 18, the operation part 204 provides analytic areas 1601 for the activation region 402 and analytic areas 1602 for the element isolation region 403 alternately over the edge profile 900 correspondingly to the width W and the pitch T of the activation region 402 of the design data. Then, the operation part 204 obtains the representative value AEI_A(x) of line-widths 406' included in the analytic areas 1601 for the activation region 402 and the representative value AEI_S(x) of line-widths 406' included in the analytic areas 1602 for the element isolation region 403. Here, an average of line-widths is determined as the representative value AEI_A(x).

Then, the operation part 204 calculates the difference DIF(x)=AEI_A(x)−AEI_S(x) between them (S306).

Similarly to the above-described first embodiment, the operation part 204 sets a shift amount Δx (in the range of 0—the pitch T), and obtains DIF(x) while shifting the start point 1603 for the position x of the analytic areas 1601 and 1602 by the shift amount Δx (in the range of 0—the pitch T).

Figure 19:
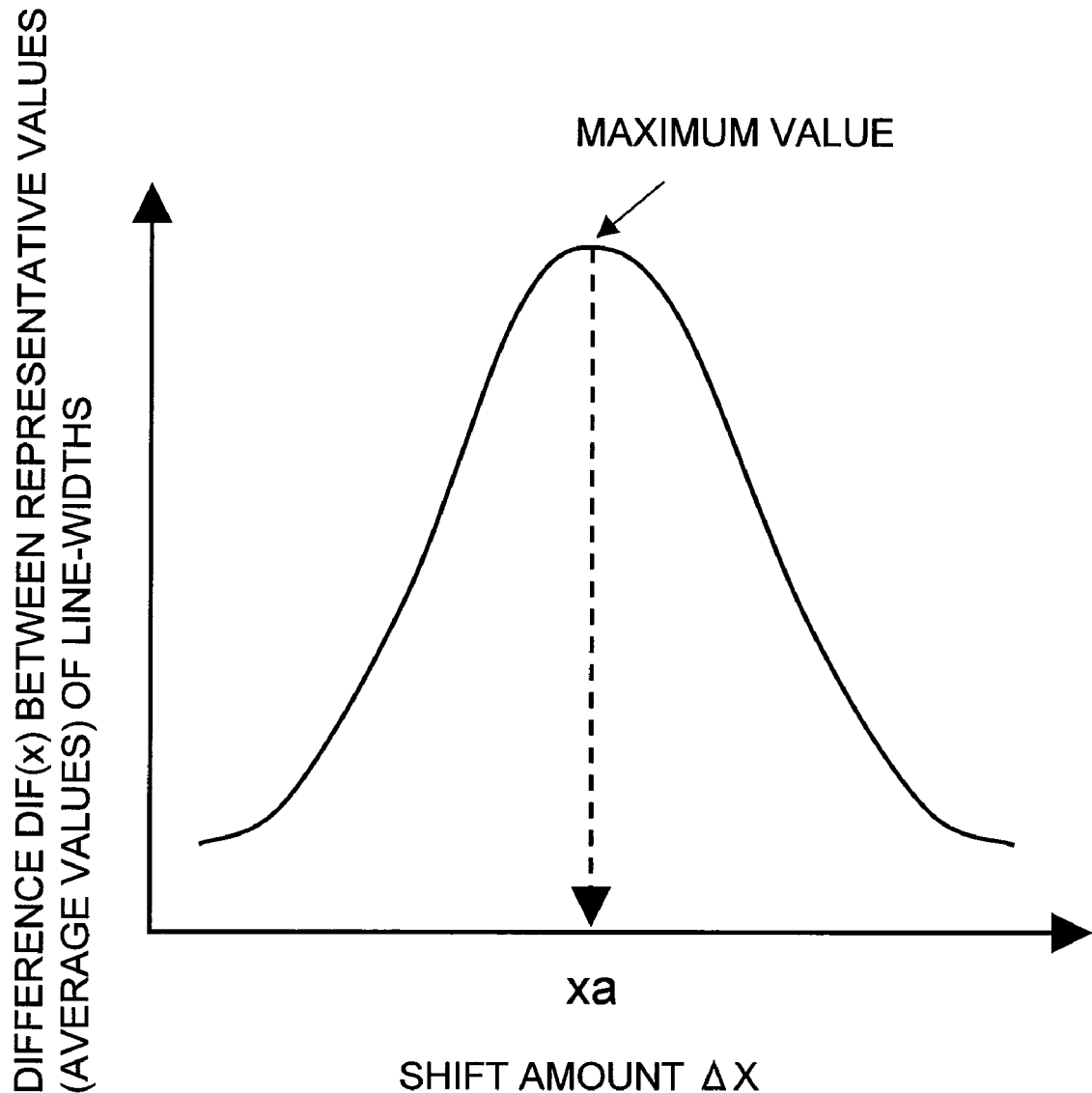
FIG. 19 is a diagram sowing a characteristic curve (a relation between a shift Δx of analytic area and a difference DIF(x)) according to the third embodiment.

As a result, a relation (characteristic curve) between the shift amount Δx and the difference DIF(x) between the representative values is obtained as shown in FIG. 19.

The operation part 204 obtains the maximum value of the difference DIF(x) of averages, and obtains the analytic area position xa at which that maximum value is obtained (S308).

Then, the operation part 204 obtains the average value AEI_A (x=xa) at that position xa for the analytic areas 1601 of the activation region, and determines the obtained value as the wiring dimension 406 of the gate electrode 401 on the activation region 402 (S309).

Hereinabove, the third embodiment has been described. According to the third embodiment, it is possible to detect the actual position of the activation region with high accuracy and to obtain the wiring dimension of the gate electrode with more accuracy in comparison with the analysis method using only the analytic areas of the activation region.

Figure 20:
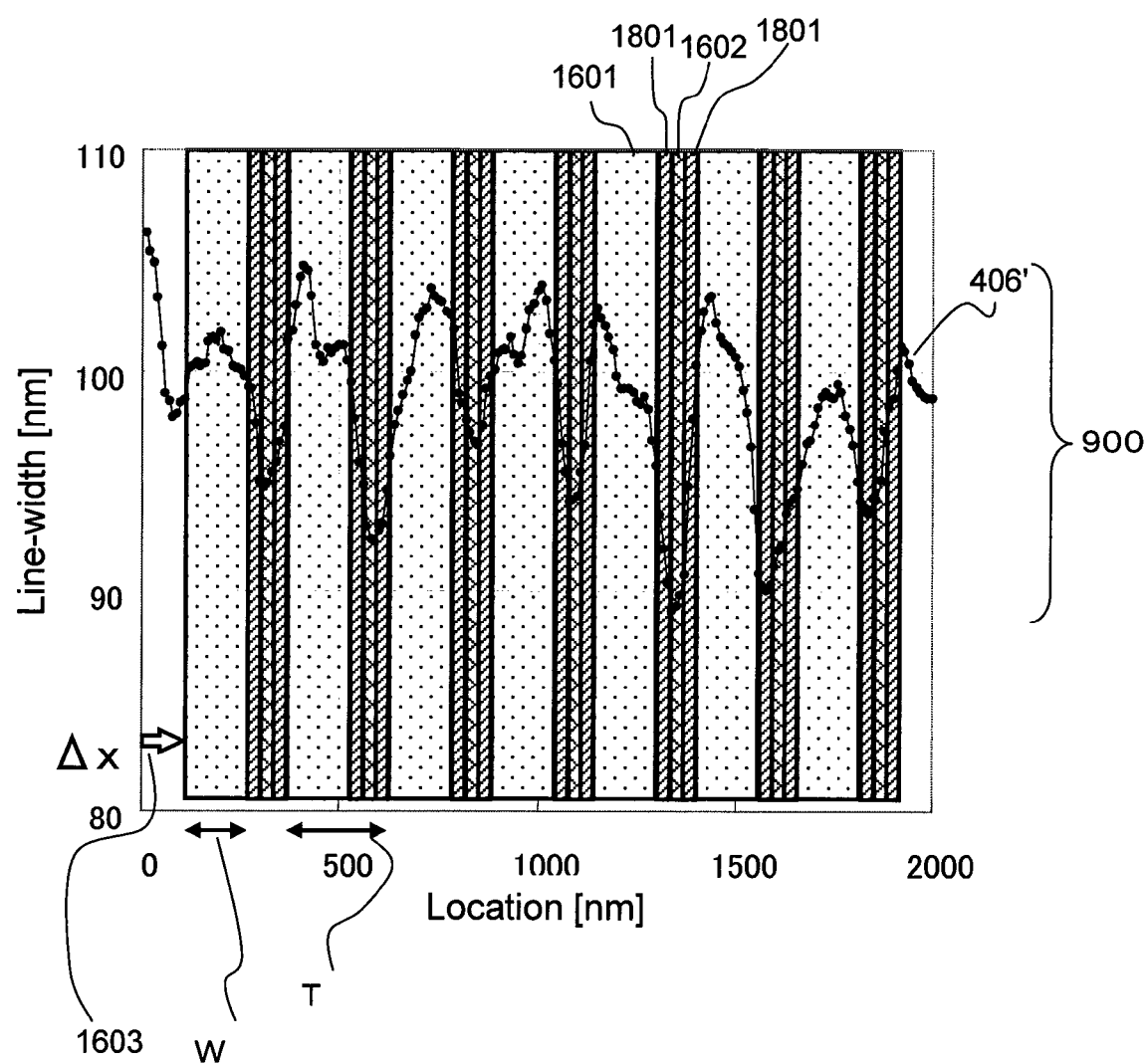
FIG. 20 is a diagram showing an arrangement of analytic areas according to a variation of the third embodiment.

The third embodiment can be modified variously without being limited to the above description. For example, as shown in FIG. 20, it is also effective to provide non-analytic areas 1801 on both sides of the analytic areas 1601 of the activation region.

As shown in FIG. 5, sometimes the ends of the element isolation region 403 are slopes. In that case, when an image is obtained by a CD-SEM, the brightness of the slopes part becomes higher. Accordingly, it is feared that dimension measurement based on a brightness profile may reduce accuracy when the width of wiring located on the slopes is measured. Thus, the non-analytic areas 1801 are provided in order to avoid inclusion of line-widths 406' corresponding to these slope parts into calculation. As a result, it is possible to improve the measurement accuracy of line-widths.

In detail, the operation part 204 provides the analytic areas 1601 of the activation region 402 on the edge profile 900 correspondingly to the width W and the pitch T of the activation region 402 of the design data, and provides non-analytic areas 1801 of a prescribed width on both sides of each analytic area 1601. Then, the remaining areas are made to be the analytic areas 1602 of the element isolation region 403. By this operation, it is possible to avoid inclusion of line-widths 406' belonging to the non-analytic areas 1801 into the calculation of the representative value in the processing shown in FIG. 17.

In the present embodiment, the average value at the coordinate xa at which DIF(x) takes the extreme value is determined as the representative value. However, the present embodiment is not limited to this. Not only the average value for the analytic areas at x=xa but also the maximum value or the minimum value for the analytic areas, or the standard deviation (generally called Line Width Roughness) of line-widths in the analytic areas or the standard deviation (generally called Line Edge Roughness) of coordinates of edge points EP in the analytic areas may be determined as the representative value.

Fourth Embodiment

A fourth embodiment has a configuration similar to that of the above-described first embodiment, and description of the common parts will be omitted.

In the above embodiments, measurement of the line-width 406 of the gate electrode 401 has been described. In the present embodiment, measurement of a dimension of the resist pattern 412 will be described.

Figure 21:
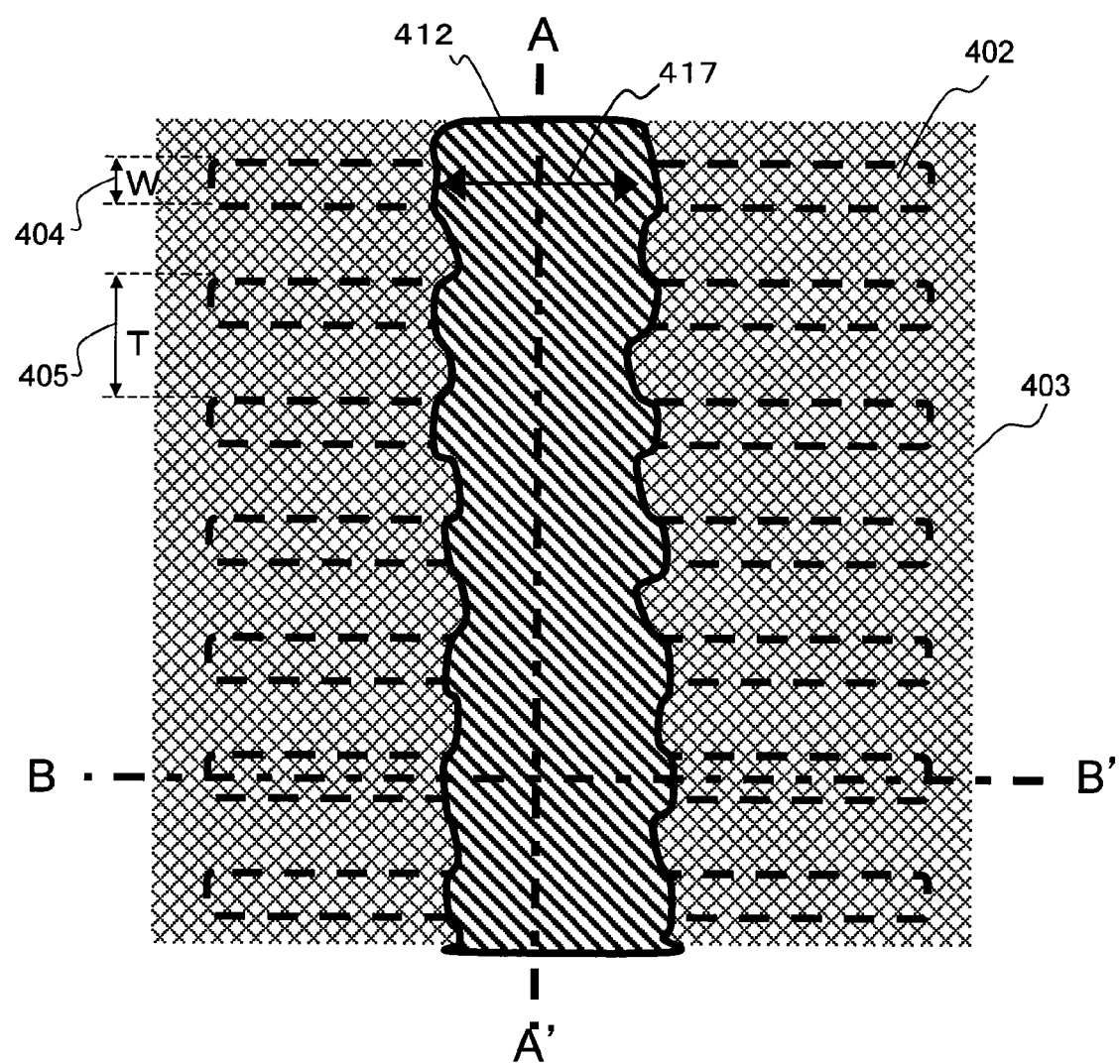
FIG. 21 is a diagram showing a wiring image of a resist pattern according to a fourth embodiment.
Figure 22A:
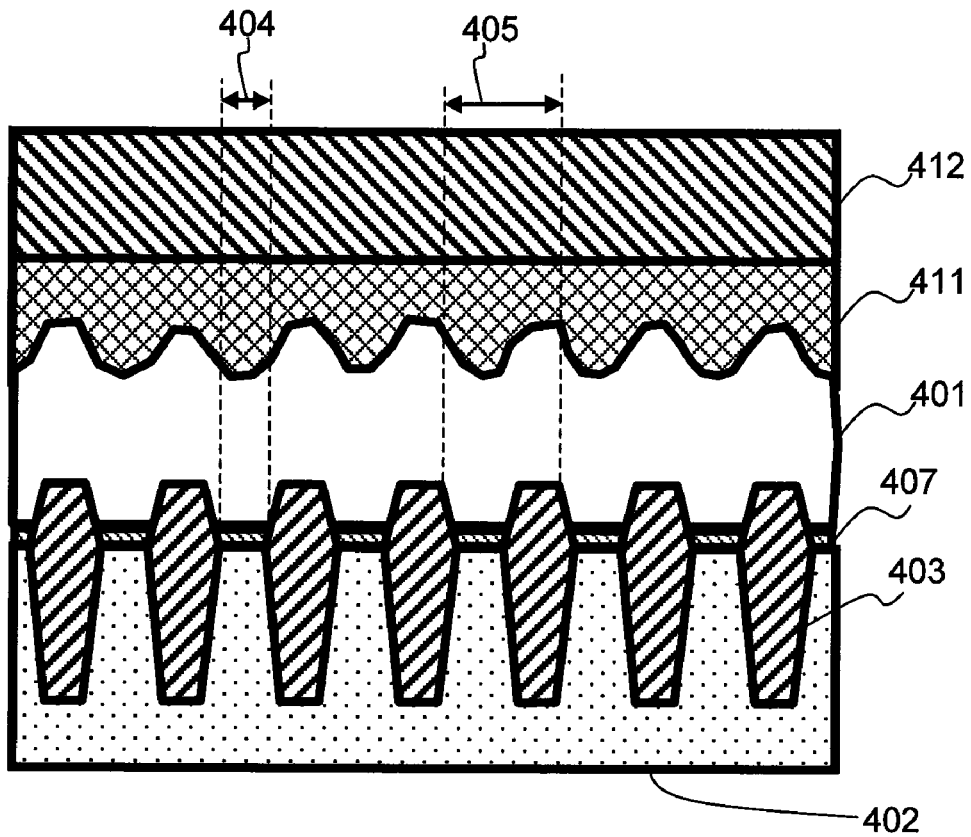
FIG. 22(A) is a cross section showing a resist pattern taken along the A-A' line according to the fourth embodiment, and FIG. 22(B) a cross section taken along the B-B' line.
Figure 22B:
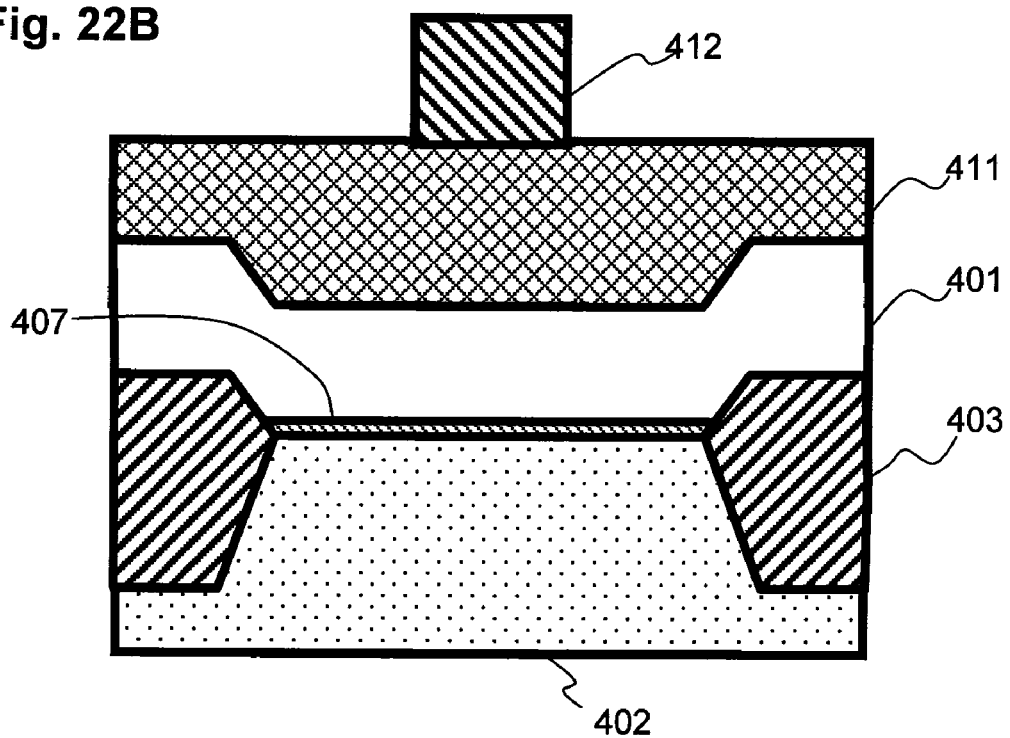
Figure 23:
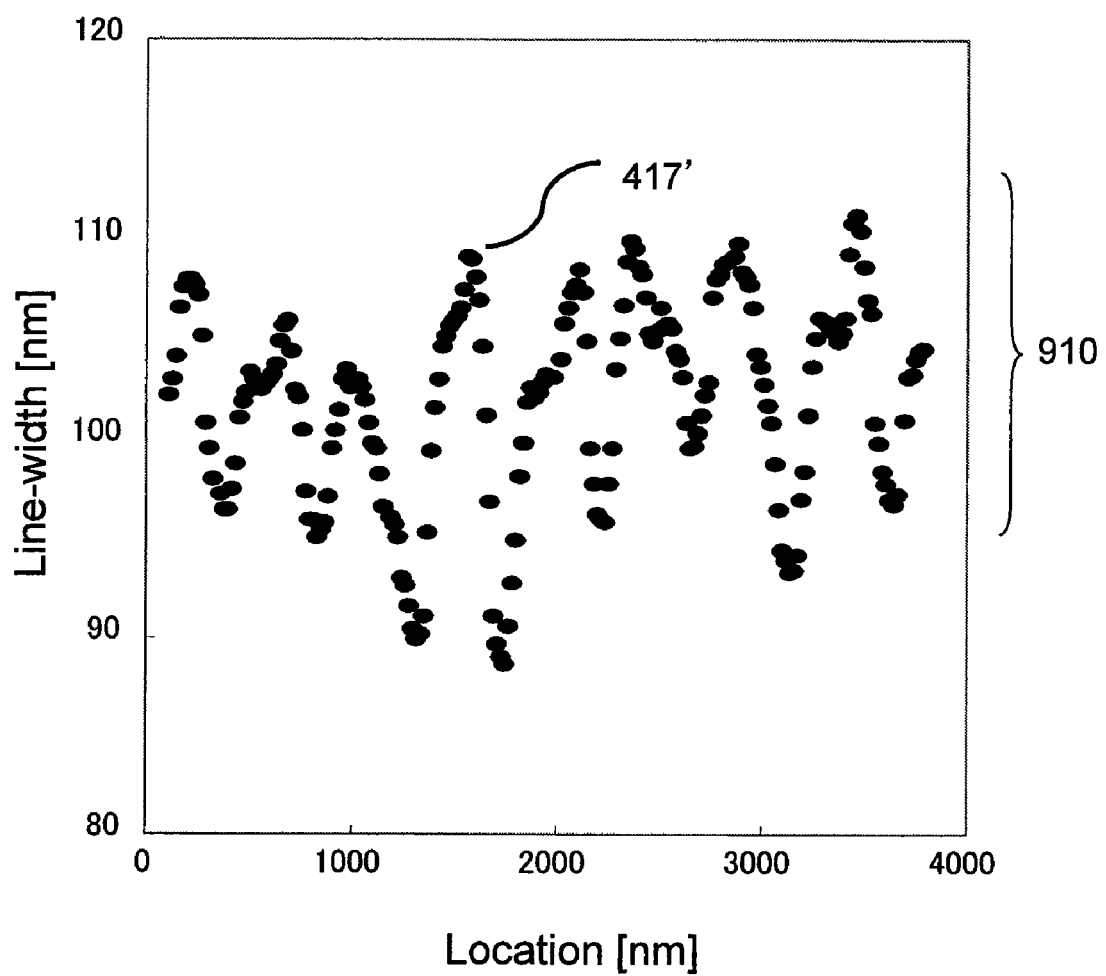
FIG. 23 is a diagram showing an edge profile of a resist pattern according to the fourth embodiment.

FIG. 21 is a top view showing a semiconductor device in which the resist pattern 412 is formed on the antireflection film 411 that is formed in turn on the activation region 402. FIG. 22(A) is a cross section (taken along the A-A' line of FIG. 21) in the longitudinal direction of the resist pattern 412, and FIG. 22(B) is a cross section (taken along the B-B' line of FIG. 21) in the longitudinal direction of the activation region 402. FIG. 23 is a diagram showing an edge profile 910 of line-width 417' of the resist pattern 412.

In the case where periodic structure of the activation region 402 exists in the lower layer, also the line-width 417 of the resist pattern 412 varies synchronously with that periodicity as shown in FIG. 23.

As shown in FIG. 22, this is because the film thickness of the antireflection film 411 varies synchronously with the periodic structure of the activation region 402 as seen from the cross sections. In a lithography process, the variation in the film thickness of the antireflection film 411 leads to variation also in the dimension of the resist pattern 412 since the quantity of light reflecting from the lower layer varies. As a result, the dimension of the resist pattern 412 also varies synchronously with the pitch 405 of the activation region 402 in the lower layer.

Thus, as shown in FIG. 23, employing a technique similar to the technique of the first embodiment, an edge profile 910 of line-widths 417' at various portions of the resist pattern 412 is obtained. Further, by using the design data of the activation region 402, the dimension 417 of the resist pattern 412 on the activation region 402 can be calculated by a technique similar to the technique of the first embodiment.

According to the present embodiment, it is possible to measure not only the wiring dimension 406 of the gate electrode 401 on the activation region 402 but also the dimension 417 of the resist pattern 412 on the activation region 402 with high accuracy and at a high speed. As a result, it is possible to control the dimension 417 of the resist pattern 412 with high accuracy after the lithography process. For example, when there is an abnormal value of the dimension 417 of the resist pattern 412, it is considered to perform the lithography process again or to perform feedback control with respect to subsequent wafers or lots.

Fifth Embodiment

A fifth embodiment has a configuration similar to those of the above-described first through fourth embodiments, and description of the common parts will be omitted.

Figure 24:
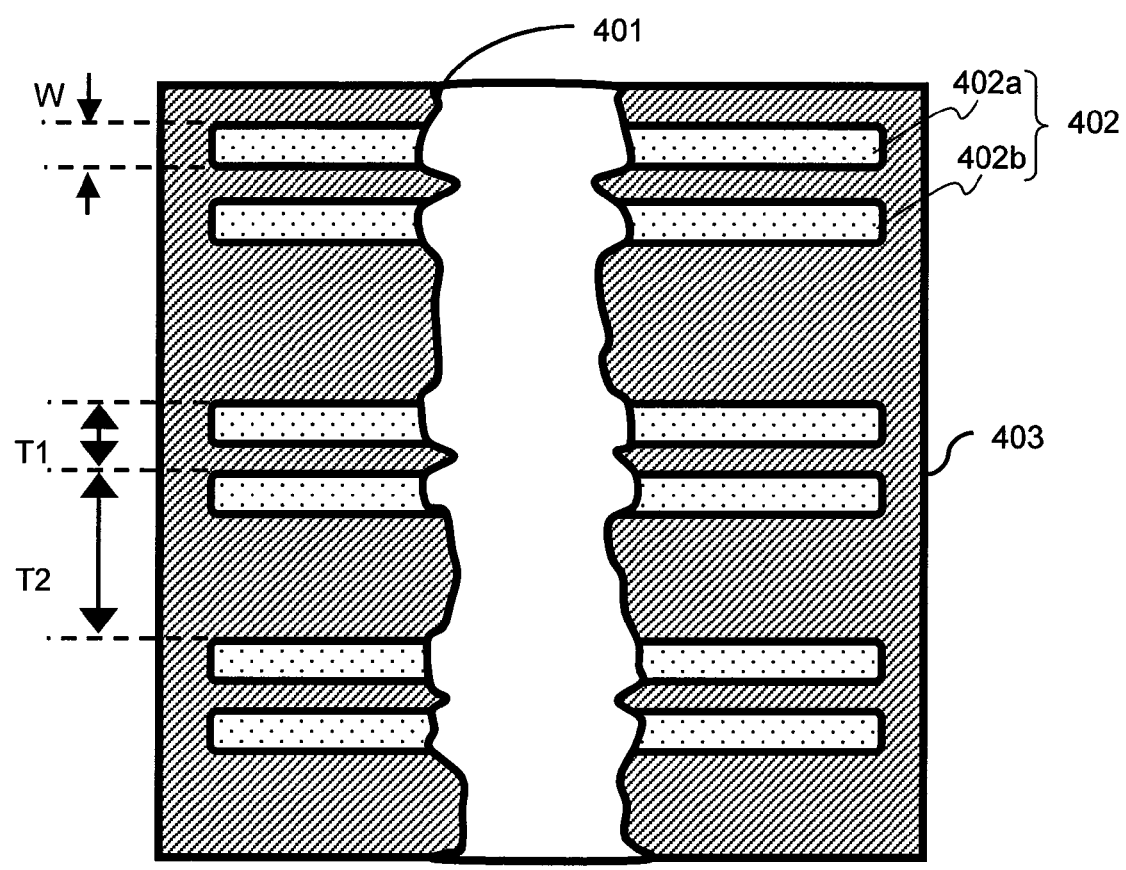
FIG. 24 is a diagram showing a wiring image of a gate electrode according to a fifth embodiment.

In the present embodiment, measurement of a dimension of a pattern in an upper layer will be described in the case where a pattern in a lower layer has a plurality of periods. It is assumed that an activation region 402 is formed to have two kinds of band-shaped regions 402a and 402b that have the same width and are arranged at the pitches T1 and T2 as shown in FIG. 24.

Figure 25:
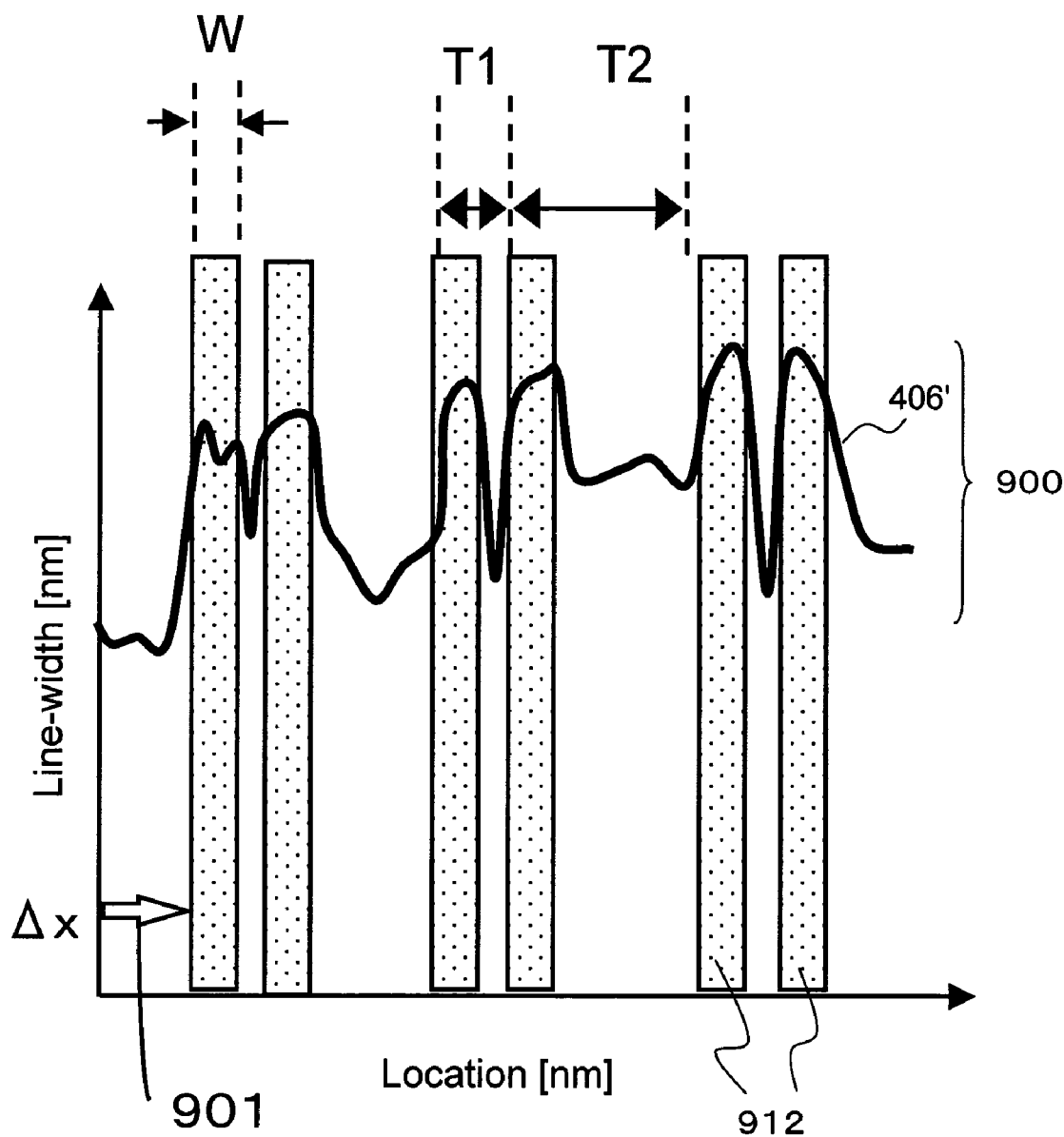
FIG. 25 is a diagram showing an edge profile of a gate electrode according to the fifth embodiment.
Figure 26:
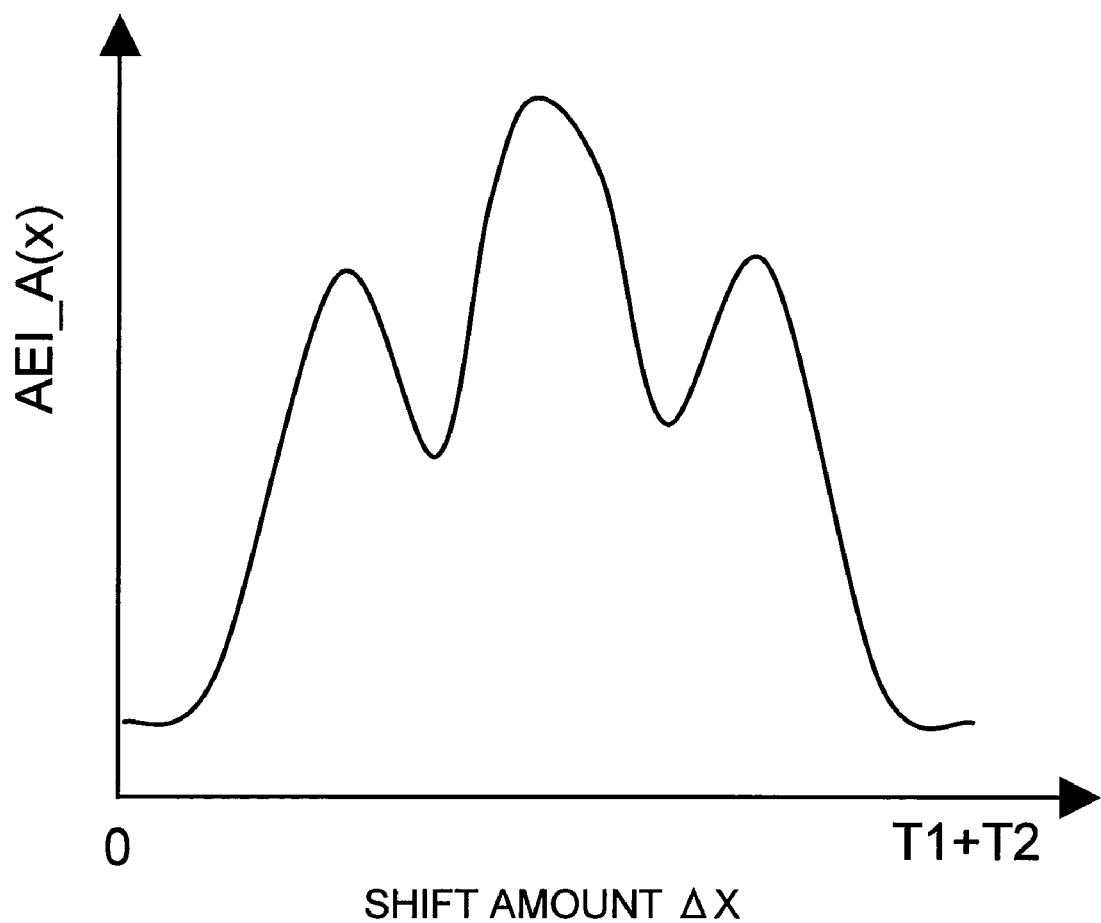
FIG. 26 is a diagram showing a characteristic curve according to the fifth embodiment.

In such a case, the operation part 204 obtains the width W and the pitches T1 and T2 of the activation region 402 from the design data. Thereafter, similarly to the above-described flow of FIG. 6, the wiring dimension 406 of the gate electrode is obtained. In detail, as shown in FIG. 25, the analytic areas 912 are set to correspond to the width W and the pitches T1 and T2, and the shift amount Δx is set to the value between 0 and (T1+T2). Then, similarly to the above-described first embodiment, a relation between the shift amount Δx and the representative value (here, the average value) AEI_A(x) is obtained. FIG. 26 shows a characteristic curve (the relation between the shift amount Δx and the representative value AEI_A(x)) obtained at this time. Then, the operation part 204 determines the maximum value of this characteristic curve as the measured value.

Here, the positional relation between the two band-shaped regions 402a and 402b constituting the activation region 402 has been set by the pitches. However, without being limited to this, the relation may be set by intervals (T1−W) and (T2−W) between the two band-shaped regions 402a and 402b.

Sixth Embodiment

A sixth embodiment has a configuration similar to those of the above-described first through fourth embodiments, and description of the common parts will be omitted.

In the present embodiment, will be described a method of measuring a dimension of the gate electrode on an activation region of a kind having a specific shape in the case where the activation region includes kinds of regions that have respective shapes and are arranged periodically.

Figure 27:
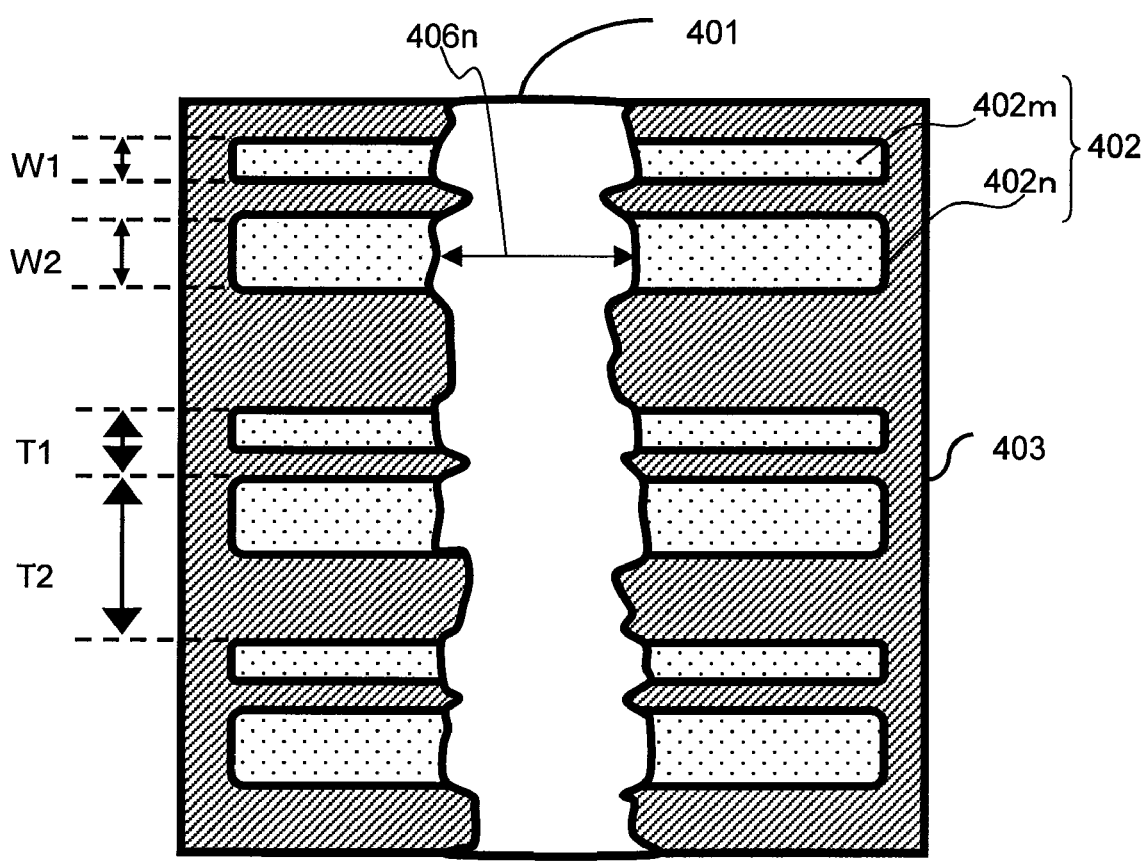
FIG. 27 is a diagram showing a wiring image of a gate electrode according to a sixth embodiment.

It is assumed that there are two kinds of band-shaped activation regions 402m and 402n that have respective widths W1 and W2 and are arranged at pitches T1 and T2 as shown in FIG. 27. Further, it is assumed that the operation part 204 measures the dimension 406n of the gate electrode 401 on the activation region 402n of the width W2.

Figure 28:
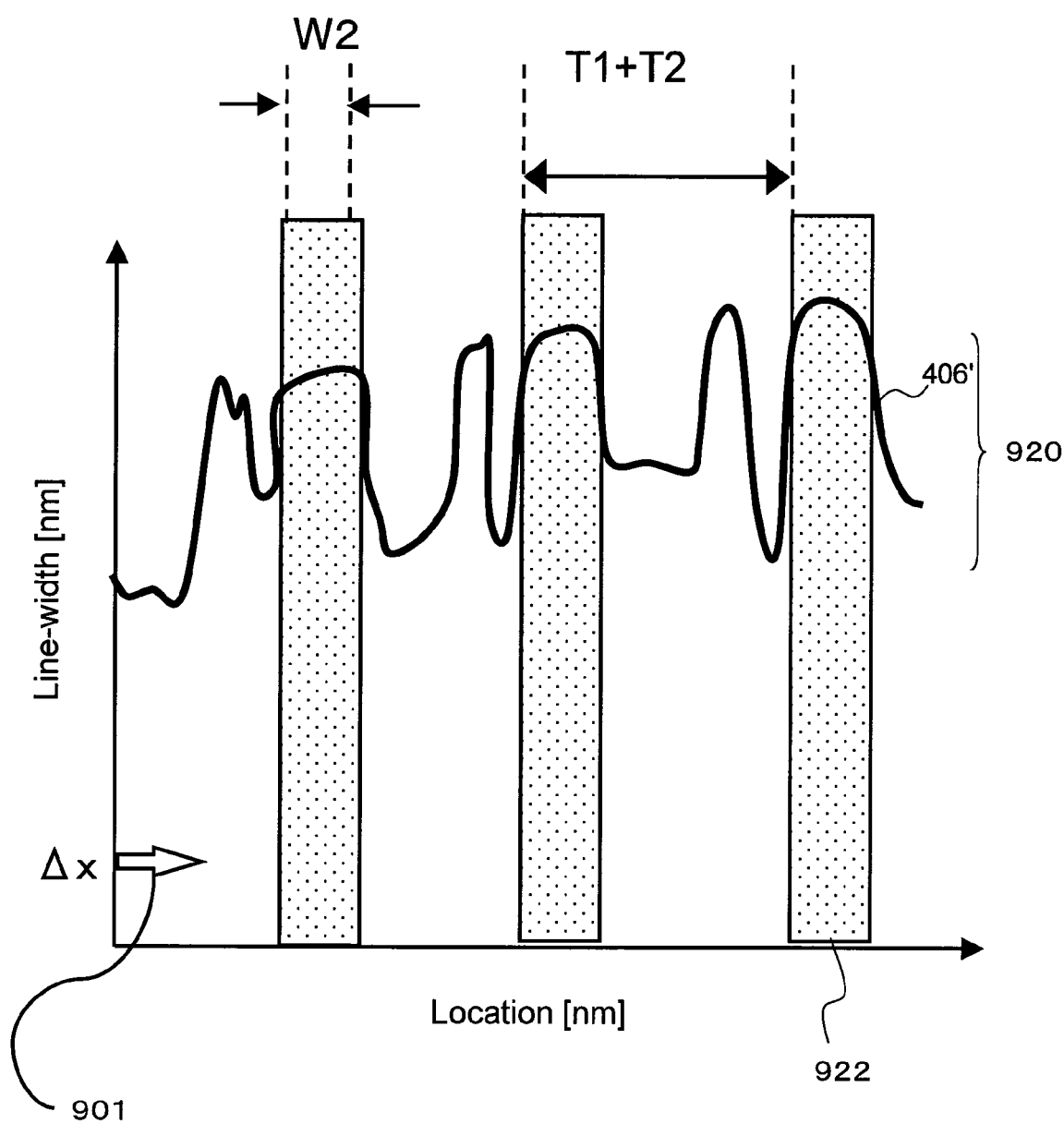
FIG. 28 is a diagram showing an edge profile of a gate electrode according to the sixth embodiment.

First, the operation part 204 obtains the width W2 of the activation region 204n and the pitches T1 and T2 from the design data. Next, as shown in FIG. 28, the analytic areas 922 are set on the edge profile 920 to correspond to the width W2 and the pitches T1 and T2. Then, by setting the shift amount Δx between 0 and (T1+T2), the representative value AEI_A(x) is obtained while shifting the analytic areas 922 by the shift amount Δx similarly to the above-described first embodiment.

Figure 29:
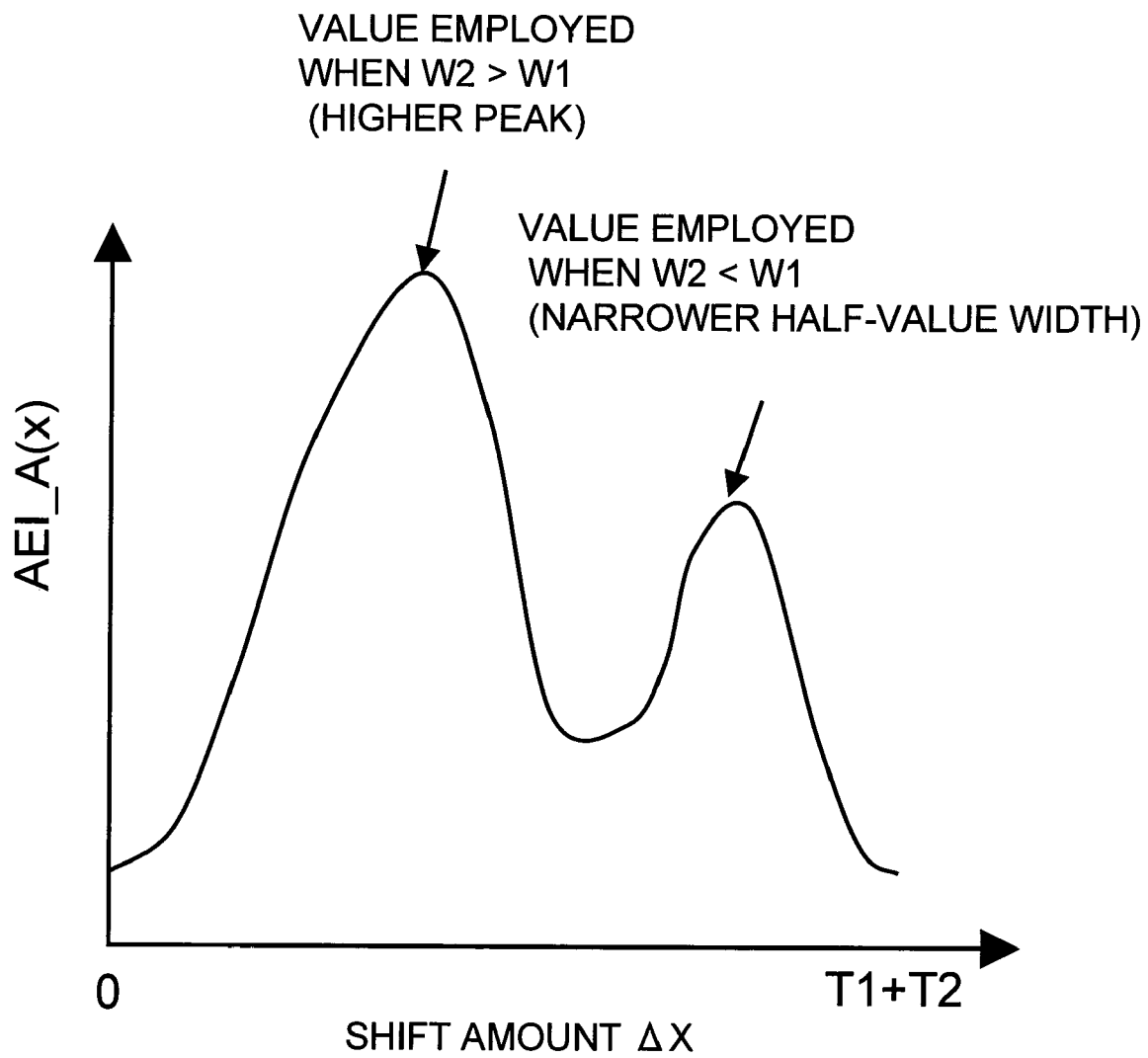
FIG. 29 is a diagram showing a characteristic curve according to the sixth embodiment.

FIG. 29 shows a characteristic curve (relation between the shift amount Δx and the representative value AEI_A(x)) obtained at that time. As shown in the figure, there are two peaks. When the width of the analytic areas 922 deviates from the width of the activation region 402, the maximum value and the half-value width of one peak become different from those of the other peak. In the case where W2>W1, the operation part 204 determines the maximum value of the two peaks is determined as the wiring dimension 406n. On the other hand, in the case where W2<W1, the local maximum value of the peak for which the half-value width is narrower is determined as the wiring dimension 406n. By this method, it is possible to measure the dimension of the gate electrode 401 on a target activation region even if there are kinds of activation regions.

Hereinabove, some embodiments have been described. It is also possible to combine those embodiments suitably.

By applying the present invention, it is possible to measure a dimension on an activation region with high accuracy, and, as a result, the control accuracy of a semiconductor device is improved since that dimension directly affects the performance and yield of a semiconductor device. Consequently, the performance and yield of the semiconductor device can be improved.

In the above embodiments, methods of measuring a dimension of a line pattern in a manufacturing process of a semiconductor device have been described. However, the present invention can be applied to a manufacturing process of a device that is manufactured by using a technique similar to one used in a method of manufacturing a semiconductor device such as a Micro Electro Mechanical System (MEMS), a Charge Coupled Device (CCD), or the like.

The invention claimed is:

1. A dimension measuring apparatus used for measuring a dimension of a semiconductor device having a first pattern of repeated structure and a second pattern that is linear and formed on the first pattern to extend over the repeated structure, comprising:
    a shape information acquisition means, which acquires information on a shape of the first pattern;
    a width value acquisition means, which acquires a width value of each portion of the second pattern on a basis of an observation result of the second pattern by a microscope;
    an analytic area setting means, which sets a plurality of analytic areas on the second pattern such that the analytic areas are adapted for the first pattern's shape acquired by the shape information acquisition means; and
    a dimension determining means, which extracts, for each of the set analytic areas, width values of portions included in the analytic area in question out of width values acquired by the width value acquisition means, and uses the extracted width values to determine a dimension of the second pattern at portions overlapping the first pattern.

2. A dimension measuring apparatus used for measuring a dimension of a semiconductor device having a first pattern of repeated structure and a second pattern that is linear and formed on the first pattern to extend over the repeated structure, comprising:
    a shape information acquisition means, which acquires information on a shape of the first pattern;
    a width value acquisition means, which acquires a width value of each portion of the second pattern on a basis of an observation result of the second pattern by a microscope;
    an analytic area setting means, which sets a plurality of analytic areas on the second pattern such that the analytic areas are adapted for the first pattern's shape acquired by the shape information acquisition means;
    a representative value calculation means, which extracts, for each of the set analytic areas, width values of portions included in the analytic area in question out of width values acquired by the width value acquisition means, and uses the extracted width values to calculate a representative value of the width values; and
    a dimension determining means, which uses the representative value (calculated by the representative value calculation means) of the width values for each analytic area to determine a dimension of the second pattern at portions overlapping the first pattern.

3. A dimension measuring apparatus used for measuring a dimension of a semiconductor device that has periodic structure in a lower layer and a line pattern formed to extend over the periodic structure, comprising:

an image acquisition means, which acquires a microscope image of an area including the line pattern;

an edge profile generation means, which obtains a line width from edge points in a transverse direction of the line pattern by using an image acquired by the image acquisition means, and generates a data series associating each position of edge points with a line width;

an information acquisition means, which acquires information on a width and a pitch of an area forming the periodic structure along a longitudinal direction of the line pattern;

a representative value calculation means, which calculates a representative value of line widths for each location position of analytic areas by performing a series of processes, including a process of locating the analytic areas on the data series generated by the edge profile generation means, with the analytic areas being adapted for the width and pitch of the area forming the periodic structure, a process of extracting the line widths associated with positions of edge points included in the analytic areas, and a process of calculating the representative value of the line widths of the line pattern in the analytic areas, while shifting a position of the analytic areas by a prescribed length on the data series along the longitudinal direction of the line pattern; and a dimension determining means, which determines a dimension of the line pattern by using the obtained representative values and according to a previously-determined rule.

4. A dimension measuring apparatus of claim 3, wherein the representative value calculation means performs the series of processes while shifting a width of the analytic areas, to calculate the representative value of the line widths for each location position and each width of the analytic areas.

5. A dimension measuring apparatus of claim 3, wherein the representative value calculation means performs the series of processes while shifting a pitch of the analytic areas, to calculate the representative value of the line widths for each location position and each pitch of the analytic areas.

6. A dimension measuring apparatus of claim 3, wherein in the series of processes, the representative value calculation means:

locates first analytic areas and second analytic areas on the data series generated by the edge profile generation means, with the first analytic areas being adapted for the width and pitch of the area forming the periodic structure and with the second analytic areas being adapted for other area than the area forming the periodic structure;

extracts line widths associated with positions of edge points included in the first analytic areas and calculates a first representative value of the line widths by using the extracted line widths; and extracts line widths associated with positions of edge points included in the second analytic areas and calculates a second representative value of the line widths by using the extracted line widths, wherein the dimension determining means determines the dimension of the line pattern by using the first representative value and the second representative value and according to a previously-determined rule.

7. A dimension measuring apparatus of claim 6, wherein the representative value calculation means provides non-analytic areas of prescribed widths between the first analytic areas and the second analytic areas.

8. A dimension measuring apparatus of claim 3, wherein the dimension determining means determines the dimension of the line pattern by using a maximum value of the representative values.

9. A dimension measuring apparatus of claim 6, wherein the dimension determining means determines the dimension of the line pattern by using a difference between the first representative value and the second representative value and according to a previously-determined rule.

10. A dimension measuring apparatus of claim 3, wherein the periodic structure in the lower layer comprises an activation region and an element isolation region.

11. A dimension measuring apparatus of claim 3, wherein the line pattern is a pattern of a gate electrode.

12. A dimension measuring apparatus of claim 3, wherein the line pattern is a resist pattern before processing of a gate electrode.

13. A dimension measuring apparatus of claim 3, wherein the line pattern is a pattern of an offset spacer.

14. A dimension measuring apparatus of claim 3, wherein the line pattern is a pattern of a Lightly Doped Drain (LDD) spacer.

15. A dimension measuring method for a dimension measuring apparatus for a semiconductor device, wherein the dimension measuring apparatus measures a dimension of a semiconductor device having a first pattern of repeated structure and a second pattern that is linear and formed on the first pattern to extend over the repeated structure, comprising:

a shape information acquisition step, in which information on a shape of the first pattern is acquired;

a width value acquisition step, in which a width value of each portion of the second pattern is acquired on a basis of an observation result of the second pattern by a microscope;

an analytic area setting step, in which a plurality of analytic areas are set on the second pattern such that the analytic areas are adapted for the first pattern's shape acquired in the shape information acquisition step; and a dimension determining step, in which, for each of the set analytic areas, width values of portions included in the analytic area in question are extracted out of width values acquired in the width value acquisition step, and the extracted width values are used to determining a dimension of the second pattern at portions overlapping the first pattern.

* * * * *